(12) United States Patent
Hatori et al.

(10) Patent No.: US 7,510,941 B2
(45) Date of Patent: Mar. 31, 2009

(54) SEMICONDUCTOR DEVICE AND MANUFACTURING METHOD OF THE SAME

(75) Inventors: Makoto Hatori, Fussa (JP); Yutaka Hoshino, Akishiama (JP)

(73) Assignee: Renesas Technology Corp., Tokyo (JP)

( * ) Notice: Subject to any disclaimer, the term of this patent is extended or adjusted under 35 U.S.C. 154(b) by 392 days.

(21) Appl. No.: 11/222,779

(22) Filed: Sep. 12, 2005

(65) Prior Publication Data
US 2006/0057793 A1    Mar. 16, 2006

(30) Foreign Application Priority Data
Sep. 10, 2004    (JP) .............................. 2004-263670

(51) Int. Cl.
*H01L 21/336*    (2006.01)
(52) U.S. Cl. ................ 438/286; 438/304; 257/E21.427
(58) Field of Classification Search ................ 438/135, 438/140, 286, 304, 596; 257/E21.427
See application file for complete search history.

(56) References Cited

U.S. PATENT DOCUMENTS 6,222,229 B1 *  4/2001  Hebert et al. ............... 257/327

FOREIGN PATENT DOCUMENTS

JP    2004-221344    8/2004

* cited by examiner

*Primary Examiner*—Chandra Chaudhari
(74) *Attorney, Agent, or Firm*—Antonelli, Terry, Stout & Kraus, LLP.

(57) ABSTRACT

The invention improves the performance of a semiconductor device. A metal silicide film is formed by a silicide process on a gate electrode and an $n^+$-type source region of an LDMOSFET, and no such metal silicide film is formed on an $n^-$-type offset drain region, an n-type offset drain region, and an $n^+$-type drain region. A side wall spacer comprising a silicon film is formed via an insulating film on the side wall of the gate electrode over the drain side thereof, and a field plate electrode is formed by this side wall spacer. The field plate electrode does not extend above the gate electrode, and a metal silicide film is formed over the entire upper surface of the gate electrode in the silicide process.

5 Claims, 19 Drawing Sheets

SEMICONDUCTOR DEVICE AND MANUFACTURING METHOD OF THE SAME

CROSS-REFERENCE TO RELATED APPLICATION

The present application claims priority from Japanese patent application No. 2004-263670 filed on Sep. 10, 2004, the content of which is hereby incorporated by reference into this application.

BACKGROUND OF THE INVENTION

1. Field of the Invention

The present invention relates to a semiconductor device and manufacturing method of the same, and more particularly to a technology that can be effectively employed in semiconductor devices used in RF (Radio Frequency) power modules and manufacturing technology of the same.

2. Description of the Related Art

In recent years, mobile communication devices (the so-called portable phones) represented by communication systems GSM (Global System for Mobile Communications), PCS (Personal Communication Systems), PDC (Personal Digital Cellular) systems, and CDMA (Code Division Multiple Access) systems became popular throughout the world.

Generally, such mobile communication devices comprise an antenna for emitting and receiving electromagnetic waves, a high-frequency power amplifier (RF power module) for amplifying the high-frequency signal that was power modulated and supplying it to the antenna, a reception unit for processing the high-frequency signal received by the antenna, a control unit for controlling the above-described units, and a battery for supplying a power source voltage thereto.

JP-A-2004-221344 describes a technology for forming a field plate electrode on the side surface of the gate electrode on the drain side thereof by using a photoresist film as a mask and dry etching a polysilicon film.

Compound semiconductor devices such as HBT, and HEMT, silicon bipolar transistors, and LDMOSFET (Laterally Diffused Metal-Oxide-Semiconductor Field Effect Transistor, laterally diffused MOSFET) have been used as amplification elements used in power amplification circuits of RF power modules of mobile communication devices according to the application object or state thereof.

Among those amplification elements, LDMOSFET employ a structure in which a high drain breakdown voltage is ensured by providing a drain region with a high dopant concentration on the drain side via an offset drain region with a low dopant concentration. The advantage of such a structure is that though the power addition efficiency is lower than that of the compound semiconductor devices, bias is easy to control and mass productivity is higher.

Diversification and globalization of cellular phones resulted in a steady improvement of performance required for RF power modules and amplification elements (semiconductor chips for amplification) used therein. For example, in performance evaluation of amplification elements (semiconductor chips for amplification) used in RF power modules, a high addition efficiency (power efficiency) is regarded as very important. Therefore, it is necessary to provide RF power modules and amplification elements (semiconductor chips for amplification) used therein that have improved performance such as addition efficiency. Forming a metal silicide film on the front surface of a gate electrode, etc., to decrease the electric resistance thereof is considered as means for increasing the addition efficiency.

With the technology of forming a field plate electrode on the side surface of the gate electrode on the drain side thereof by using a photoresist film as a mask and dry etching a polysilicon film, an alignment margin of the photomask and gate electrode is necessary with consideration for the misalignment of the photomask associated with the accuracy of the exposure apparatus or the like. For this reason the upper end portion of the field plate electrode is formed so as to cover part of the upper portion of the gate electrode. When a silicide process is applied to such a structure, the field plate electrode extends on top of the gate electrode. Therefore, the metal silicide film cannot be formed on the entire upper surface of the gate electrode.

It is an object of the present invention to provide a technology capable of improving the performance of a semiconductor device.

This and other objects as well as novel features of the present invention will become apparent from the following specification and accompanying drawings.

SUMMARY OF THE INVENTION

The concept of a representative invention of the inventions disclosed in the present application will be explained below in a simple manner.

In accordance with the present invention, a field plate electrode with a side wall spacer shape is formed via an insulating film on the side surface of the gate electrode of the LDMOSFET over the drain side thereof.

Further, in accordance with the present invention, a metal silicide film is formed on the gate electrode and on the source region of the LDMOSFET and no metal silicide film is formed on the drain region.

The present invention also provides a semiconductor device having a wiring board and a semiconductor chip mounted over the wiring board, wherein the semiconductor chip comprises an amplification circuit formed from LDMOSFET and a field plate electrode with a side wall spacer shape is formed via an insulating film on the side surface of the gate electrode of the LDMOSFET over the drain side thereof.

Further, in accordance with the present invention, a field plate electrode with a side wall spacer shape comprising a conducive film is formed via an insulating film on the side surface of the gate electrode of the LDMOSFET over the drain side thereof by anisotropically etching the conductive film.

The effect obtained with a representative invention disclosed in the present application is described in a simple manner below.

The performance of the semiconductor device can be improved.

DESCRIPTION OF THE PREFERRED EMBODIMENTS

Figure 1:
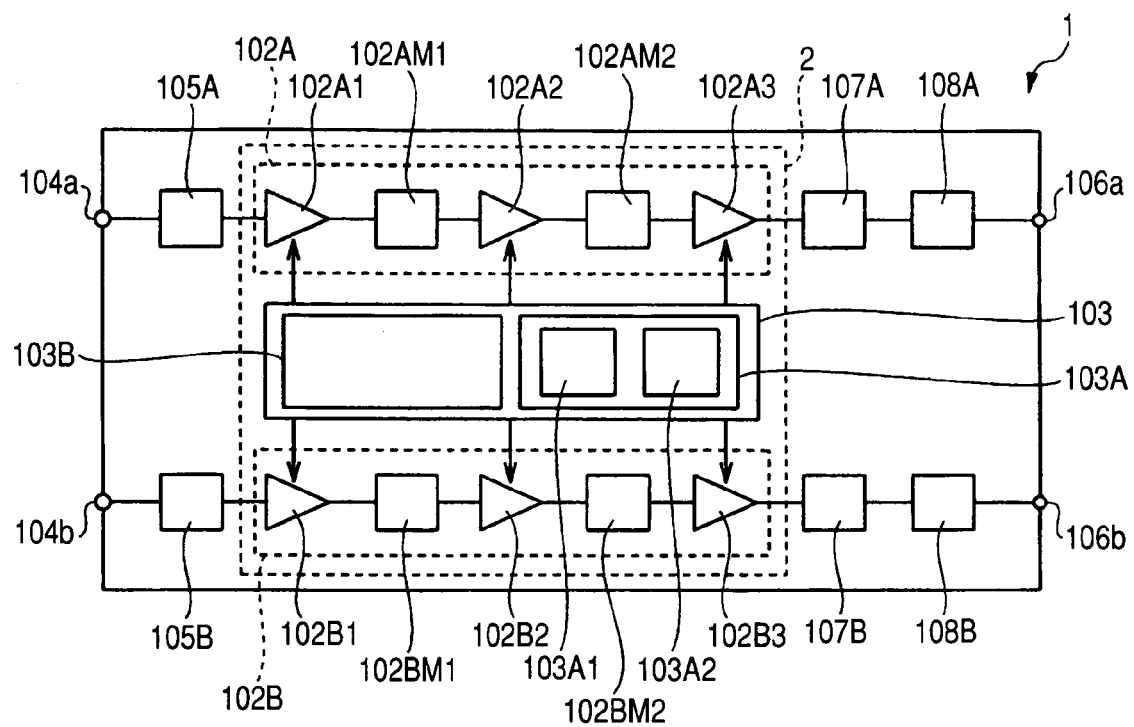
FIG. 1 is a circuit block diagram of an amplification circuit constituting the RF power module of one embodiment of the present invention.

In the below-described embodiments, for the sake of convenience, the explanation when necessary will be split into a plurality of sections, but unless clearly indicated otherwise, those sections are not unrelated and one of them is related to modification examples, detailed explanation, or auxiliary explanation of all or some of the other sections. Furthermore, in the below-described embodiments, when numbers associated with the elements (including quantities, numerical values, amounts, ranges, and the like) are presented, those specific numbers are not limiting and numbers above and below those specific numbers may be employed, unless clearly indicated otherwise and with the exception of cases where the specific numbers are in principle clearly restrictive. Furthermore, in the below-described embodiments, it goes without saying that constituent elements thereof (including elemental steps and the like) are not always necessary, unless clearly indicated otherwise and with the exception of cases when they are considered to be clearly necessary in principle. Similarly, in the below-described embodiments, when the shape and relative positions of constituent elements and the like are mentioned, the shape and relative positions close or analogous thereto will be also included, unless clearly indicated otherwise and with the exception of cases where it is in principle clearly impossible. The same is true for numerical values and ranges.

The embodiments of the present invention will be described below in greater detail with reference to the appended drawings. In all the drawings employed for explaining the embodiments, members having identical functions are assigned with identical reference symbols and redundant explanation thereof is omitted. Furthermore, in the below-described embodiments, the explanation of identical or similar portions, as a rule, will not be repeated unless it is particularly necessary.

Furthermore, in the drawings used in the embodiments, hatching is sometimes omitted to facilitate understanding of the drawings, even on cross-sectional views. Further, hatching is sometimes added to facilitate understanding of the drawings, even on plan views.

The present embodiment is a semiconductor device used (mounted) in an RF (Radio Frequency) power module employed in a digital cellular phone (mobile communication device) for transmitting information by using a network, for example, such as a GSM system.

Here, the GSM (Global System for Mobile Communication) is a specification or one of wireless communication systems used in digital cellular phones. There are three frequency bands of electromagnetic waves used in the GSM. A 900 MHz band is called GSM900 or simply GSM, a 1800 MHz band is called GSM1800, DCS (Digital Cellular System) 1800, or PCN, and a 1900 MHz band is called GSM1900, DCS 1900, or PCS (Personal Communication Services). The GSM1900 is used mainly in the North America. In the North America, a GSM850 of a 850 MHz is also sometimes used. An RF power module 1 of the present embodiment is, for example, an RF power module (high-frequency power amplification device, power amplification module, power amplifier module) used in those frequency bands (high-frequency bands). Furthermore, in the present embodiment the explanation will be conducted with respect to a dual band system that can use two frequency bands, for example, GSM900 and DCS1800, but this system is not limiting and the explanation is also applicable, for example, to a triple band system that can use three frequency bands and a quad band system that can use four frequency bands.

FIG. 1 is a circuit block diagram of an amplification circuit constituting the RF power module (high-frequency power amplification device, high-frequency power amplification module, power amplification module, semiconductor device) 1. The circuit block diagram (amplification circuit) shown in this figure is that of the RF power module 1 where two frequency bands, for example, GSM900 and DCS1800, can be used (dual band system) and that can use two communication systems: GMSK (Gaussian filtered Minimum Shift Keying) modulation system and EDGE (Enhanced Data GSM Environment) modulation system in respective frequency bands.

As shown in FIG. 1, the circuit configuration of the RF power module 1 comprises a power amplification circuit 102A for GSM900 (824-915 MHz) comprising three amplification stages 102A1, 102A2, and 102A3, a power amplification circuit 102B for DCS1800 (1710-1910 MHz) comprising three amplification stages 102B1, 102B2, and 102B3, a peripheral circuit 103 for conducting control or compensation of amplification operation of those power amplification circuits 102A, 102B, a matching circuit (input matching circuit) 105A located between an input terminal 104a for the GSM900 and the power amplification circuit 102A (first amplification stage 102A1), a matching circuit (input matching circuit) 105B located between an input terminal 104b for the DCS1800 and the power amplification circuit 102B (first amplification stage 102B1), a low-pass filter 108A and a matching circuit (output matching circuit) 107A located between an output terminal 106a for the GSM900 and the power amplification circuit 102A (third amplification stage 102A3), and a low-pass filter 108B and a matching circuit (output matching circuit) 107B located between an output terminal 106b for the DCS1800 and the power amplification circuit 102B (third-stage amplification stage 102B3). Further, a matching circuit 102AM1 for stages (interstage matching circuit) is provided between the amplification stage 102A1 and the amplification stage 102A2 of the power amplification circuit 102A for the GSM900, a matching circuit 102AM2 for stages (interstage matching circuit) is provided between the amplification stage 102A2 and the amplification stage 102A3, a matching circuit 102BM1 for stages (interstage matching circuit) is provided between the amplification stage 102B1 and the amplification stage 102B2 of the power amplification circuit 102B for the DCS1800, and a matching circuit 102BM2 for stages (interstage matching circuit) is provided between the amplification stage 102B2 and the amplification stage 102B3.

Among the above-mentioned components, the power amplification circuit 102A (amplification stages 102A1-102A3) for the GSM900, the power amplification circuit 102B (amplification stages 102B1-102B3) for the DCS1800, and the peripheral circuit 103 are formed in one semiconductor chip (semiconductor amplification element chip, power amplification element chip for high frequency) 2. In another mode, the power amplification circuit 102A for the GSM900, the power amplification circuit 102B for the DCS1800, and the peripheral circuit 103 can be also on a plurality of semiconductor chips. For example, a semiconductor chip having formed therein the amplification stages 102A1, 102B1, a semiconductor chip having formed therein the amplification stages 102A2, 102B2, and a semiconductor chip having formed therein the amplification stages 102A3, 102B3 can be formed separately.

The peripheral circuit 103 comprises a control circuit 103A and a bias circuit 103B for applying a bias voltage to the amplification stages 102A1-102A3, 102B1-102B3. The control circuit 103A is a circuit for generating the prescribed voltage to be applied to the aforementioned power amplification circuits 102A, 102B and comprises a power source control circuit 103A1 and a bias voltage generation circuit 103A2. The power source control circuit 103A1 is a circuit for generating a first power source voltage to be applied to drain terminals of amplification element (here, LDMOSFET) for output of each amplification stage 102A1-102A3, 102B1-102B3. Further, the bias voltage generation circuit 103A2 is a circuit for generating a first control voltage for controlling the bias circuit 103B. Here, if the power source control circuit 103A1 generates the first power source voltage based on a power level designation signal supplied from an external base band circuit, the bias voltage generation circuit 103A2 generates the first control voltage based on the first power source voltage generated by the power source control circuit 103A1. The base band circuit is a circuit for generating the aforementioned output level designation signal. The output level designation signal is a signal designating the output level of the power amplification circuits 102A, 102B and is generated based on the output level corresponding to the distance between the cellular phone and base station, that is, to the intensity of electromagnetic waves.

The matching circuits carry out the impedance matching, and low-pass filters 108A, 108B are the circuits for attenuating the high-frequency components (for example, double frequency and triple frequency) generated in the power amplification circuits 102A, 102B.

The RF input signal inputted into the input terminal 104a of the RF power module 1 for the GSM900 is inputted into the power amplification circuit 102A via the matching circuit 105A. The RF input signal inputted into the power amplification circuit 102A is inputted into the amplification stage 102A1 and amplified, the output of the amplification stage 102A1 is inputted into the amplification stage 102A2 via the matching circuit 102AM1 and amplified, and the output of the amplification stage 102A2 is inputted into the amplification stage 102A3 via the matching circuit 102AM2 and amplified. The output of the amplification stage 102A3, that is, the output signal of the power amplification circuit 102A is outputted from the output terminal 106a as an RF output signal via the matching circuit 107A and the low-pass filter 108A.

Further, the RF input signal inputted into the input terminal 104b of the RF power module 1 for the DCS1800 is inputted into the power amplification circuit 102B via the matching circuit 105B. The RF input signal inputted into the power amplification circuit 102B is inputted into the amplification stage 102B1 and amplified, the output of the amplification stage 102B1 is inputted into the amplification stage 102B2 via the matching circuit 102BM1 and amplified, and the output of the amplification stage 102B2 is inputted into the amplification stage 102B3 via the matching circuit 102BM2 and amplified. The output of the amplification stage 102B3, that is, the output signal of the power amplification circuit 102B is outputted from the output terminal 106b as an RF output signal via the matching circuit 107B and the low-pass filter 108B.

The power amplification circuits 102A, 102B have circuit configurations in which three n-channel LDMOSFET are successively cascade connected as the above-mentioned three amplification stages 102A1-102A3, 102B1-102B3. Thus, each amplification stage 102A1, 102A2, 102A3, 102B1, 102B2, and 102B3 is formed of an n-channel LDMOSFET, the power amplification circuit 102A is formed by successively connecting (multistage connection) the three n-channel LDMOSFET (that is, the n-channel LDMOSFET constituting the amplification stage 102A1, the n-channel LDMOSFET constituting the amplification stage 102A2, and the n-channel LDMOSFET constituting the amplification stage 102A3), and the power amplification circuit 102B is formed by successively connecting (multistage connection) the three n-channel LDMOSFET (that is, the n-channel LDMOSFET constituting the amplification stage 102B1, the n-channel LDMOSFET constituting the amplification stage 102B2, and the n-channel LDMOSFET constituting the amplification stage 102B3). In the present embodiment, the power amplification circuits 102A, 102B are formed by connecting (multistage connection) three amplification stages, but in another mode, the power amplification circuits 102A, 102B can be formed by connecting (multistage connection) two amplification stages or four or more amplification stages. In this case, the power amplification circuits 102A, 102B have a circuit configuration with a cascade connection of two or four or more n-channel LDMOSFETs.

Figure 2:
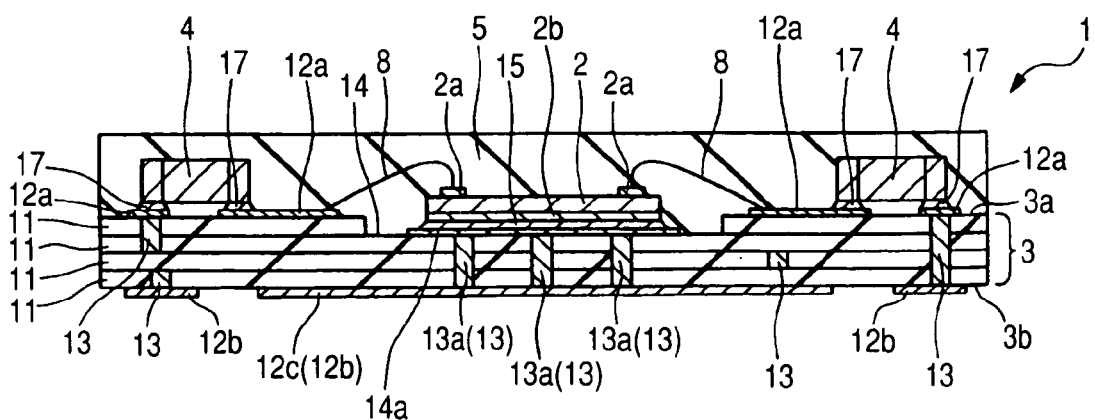
FIG. 2 is a cross-sectional view of the RF power module of one embodiment of the present invention.

FIG. 2 is a conceptual cross-sectional view of the RF power module 1 of the present embodiment.

The RF power module 1 of the present embodiment shown in FIG. 2 comprises a wiring board (module board) 3, a semiconductor chip (semiconductor element, functional element) 2 installed (mounted) on the wiring board 3, a passive component (passive element, chip component) 4 installed (mounted) on the wiring board 3, and a sealing resin (sealing resin section) 5 for covering the upper surface of the wiring board 3 comprising the semiconductor chip 2 and the passive component 4. The semiconductor chip 2 and the passive component 4 are electrically connected to a conductor layer (transmission line) of the wiring board 3. Further, the RF power module 1 can be also mounted, for example, on a motherboard or an external circuit board (not shown in the figures).

The wiring board 3 is a multilayer board (multilayer wiring board) in which, for example, a plurality of insulator layers (dielectric layers) 11 and a plurality of conductor layers or wiring layers (not shown in the figure) are laminated and integrated. In the configuration shown in FIG. 2, the wiring board 3 is formed by laminating four insulator layers 11, but the number of the laminated insulator layers 11 is not limited thereto and can be changed in a variety of ways. For example, a ceramic material such as alumina (aluminum oxide, $Al_2O_3$) can be used as the material for forming the insulator layers 11 of the wiring board 3. In this case, the wiring board 3 is a ceramic multilayer board. The material of the insulator layers 11 of the wiring board 3 is not limited to ceramic materials and can be changed in a variety of ways. For example, a glass epoxy resin may be also used.

Conductor layers (wiring layers, wiring patterns, conductor patterns) for wiring formation are formed between the upper surface 3a (front surface, main surface) and the lower surface (rear surface, main surface) 3b of the wiring board 3 and the insulator layers 11. Board-side terminals (terminals, electrodes, transmission lines, wiring patterns) 12a comprising a conductor are formed on the upper surface 3a of the wiring board 3 by the conductor layer of the uppermost layer of the wiring board 3, and the external connection terminals (terminals, electrodes, module electrodes) 12b composed of a conductor are formed on the lower surface 3b of the wiring board 3. The external connection terminals 12b correspond, for example, to input terminals 104a, 104b and output terminals 106a, 106b in FIG. 1. A conductor layer (wiring layer, wiring pattern, conductor pattern) is also formed inside the wiring board 3, that is, between the insulator layers 11, but for the sake of simplicity it is not shown in FIG. 2. Furthermore, among the wiring patterns formed by the conductor layer of the wiring board 3, the wiring patterns for supplying a reference potential (for example, a terminal 12c for supplying a reference potential of the lower surface 3b of the wiring board 3) can be formed to have a rectangular pattern so as to cover a major portion of the wiring formation surface of the insulator layer 11, and a wiring pattern for a transmission line can be formed as a band-like pattern.

The conductor layers (wiring layers) constituting the wiring board 3, if necessary, are electrically connected via a conductor or a conductor film inside the via holes 13 (through holes) formed in the insulator layers 11. Therefore, the board-side terminals 12a on the upper surface 3a of the wiring board 3, if necessary, are electrically connected to the external connection terminals 12b on the lower surface 3b of the wiring board 3 via a conductor film located inside the via holes 13 or wiring layers (wiring layers located between the insulator layers 11) located on the upper surface 3a and/or inside the wiring board 3. Further, among the via holes 13, the via holes 13a provided below the semiconductor chip 2 can also function as thermal via contacts for transmitting the heat generated in the semiconductor chip 2 to the lower surface 3b side of the wiring board 3.

The semiconductor chip 2 is a semiconductor chip 2 having formed therein a semiconductor integrated circuit corresponding to the circuit configuration surrounded by a dot line and showing the semiconductor chip 2 in the circuit block diagram in FIG. 1. Therefore, in the semiconductor chip 2 (or a surface layer portion), there is formed a semiconductor integrated circuit comprising LDMOSFET elements constituting the power amplification circuits 102A, 102B (amplification stages 102A1-102A3, 102B1-102B3 thereof) and semiconductor elements constituting the peripheral circuit 103. In the semiconductor chip 2, after the semiconductor integrated circuit has been formed on the semiconductor substrate (semiconductor wafer) comprising, for example, single-crystal silicon, the rear surface polishing is conducted, if necessary, on the semiconductor substrate and then the semiconductor substrate is separated into semiconductor chips 2 by dicing or the like.

A recess (receiving portion) 14 having a plane rectangular shape and called a cavity is provided in the semiconductor chip 2 mounting region of the wiring board 3, and the semiconductor chip 2 is die bonded face up with a joining material (adhesive), for example, a solder 15, to the conductor layer 14a located on the bottom surface of the recess 14 of the wiring board 3. A silver paste can be also used instead of the solder 15 for die bonding the semiconductor chip 2. Electrodes (bonding pads) 2a formed on the front surface (upper surface) of the semiconductor chip 2 are electrically connected to the board-side terminals 12a located on the upper surface 3a of the wiring board 3 via the bonding wire 8. Further, rear-surface electrodes 2b (correspond to the below-described rear-surface electrodes 81) are formed on the rear surface of the semiconductor chip 2, and the rear surface electrodes 2b of the semiconductor chip 2 are connected (joined) by a joining material such as the solder 15 to the conductor layer 14a on the bottom surface of the recess 14 of the wiring board 3 and further electrically connected to the terminals 12c for supplying a reference potential of the lower surface 3b of the wiring board 3 via the conductor films located in the via holes 13. Sometimes, when a design is created that is aimed at miniaturization of the wiring board, the recess 14 is not formed.

The passive components 4 comprise passive elements such as resistance elements (for example, chip resistors), capacitance elements (for example, chip capacitors, or inductor elements (for example, chip inductors) and are composed, for example, of chip components. The passive components 4 are mounted on the board-side terminals 12a of the upper surface 3a of the wiring board 3 with a joining material (adhesive) with good electric conductivity such as a solder 17. The board-side terminals 12a of the upper surface 3a of the wiring board 3 having the semiconductor chip 2 or the passive components 4 electrically connected thereto are electrically connected to the external connection terminal 12b of the lower surface 3b of the wiring substrate 3 via the conductor film located inside the via holes 13 or the wiring layer located inside the wiring board 2. The passive components 4 are the passive components forming, for example, the matching circuits (input matching circuits) 105A, 105B or matching circuits (output matching circuits) 107A, 107B. Furthermore, the passive elements forming the matching circuits (interstage matching circuits) 102AM1, 102AM2, 102BM1, 102BM2 can be formed inside the semiconductor chip 2, but in another mode, the matching circuits (interstage matching circuits) 102AM1, 102AM2, 102BM1, 102BM2 can be formed by the passive components 4 mounted on the wiring board 3.

The sealing resin 5 is formed on the wiring board 3 so as to cover the semiconductor chip 2, the passive components 4, and the bonding wire 8. The sealing resin 5 comprises a resin material, for example, an epoxy resin and a silicone resin and can comprise a filler or the like.

Figure 3:
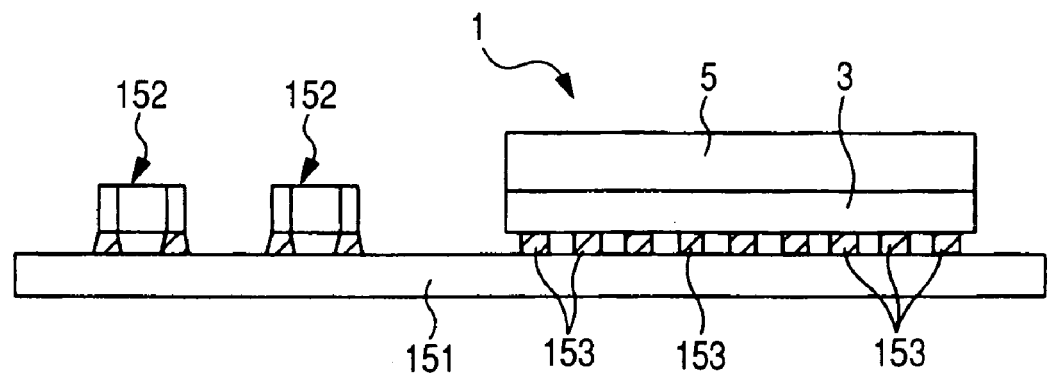
FIG. 3 is a side view of the main portion illustrating a mounting example of the RF power module of the digital cellular phone system of one embodiment of the present invention.

FIG. 3 illustrates a mounting example of the RF power module 1 in the digital cellular phone system. A motherboard 151 is composed, for example, of a printed wiring board having a multilayer wiring structure, and the RF power module 1 and additionally, if necessary, electronic components such as a plurality of chip components 152 are mounted on the main surface thereof. The RF power module 1 is mounted on the motherboard 151 in a state in which the external connection terminals 12b and terminals 12c for supplying a reference potential that are located on the lower surface 3b of the wiring board 3 face the main surface of the motherboard 151. The external connection terminals 12b and terminals 12c for supplying a reference potential of the RF power module 1 are connected to respective wiring patterns of the motherboard 151 via a joining material 153 such as a solder.

Figure 4:
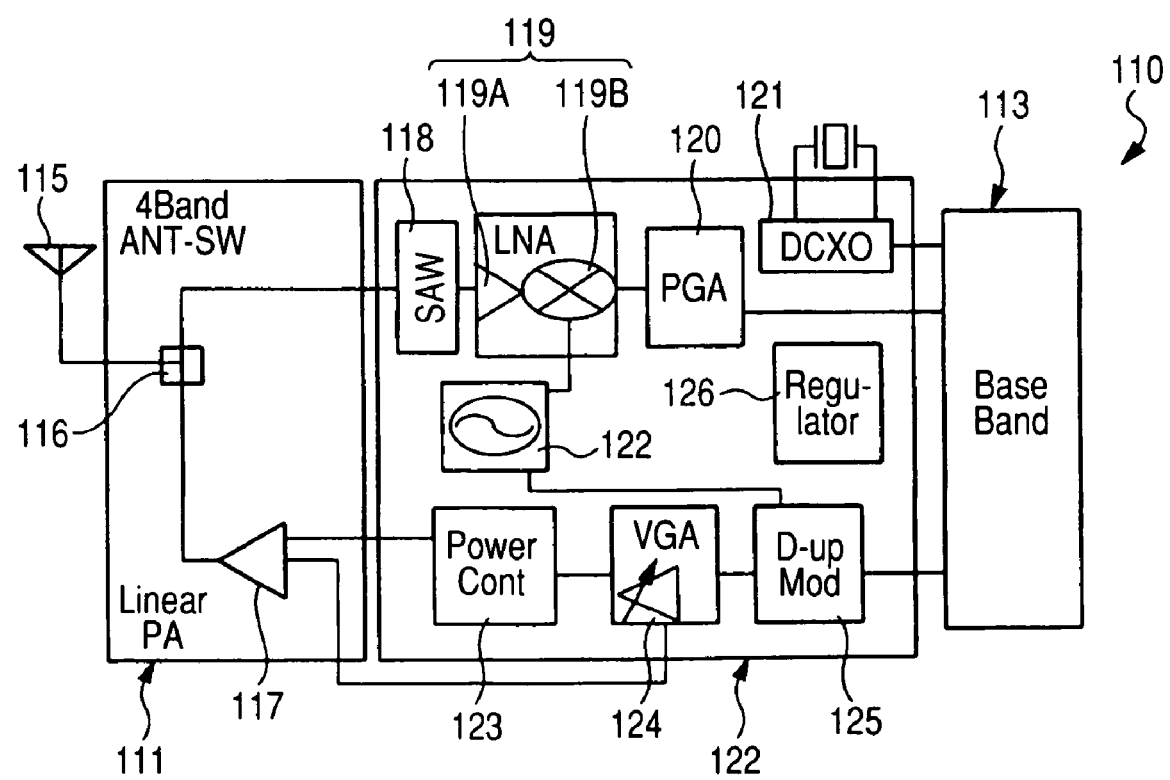
FIG. 4 is an explanatory drawing illustrating a configuration example of a high-frequency module.

FIG. 4 is an explanatory drawing (system block diagram) showing a configuration example of a high-frequency module mounted on a mobile communication apparatus such as a cellular phone. FIG. 4 shows a configuration example of a high-frequency module 110 comprising a power amplifier module corresponding to the above-described RF power module 1.

The high-frequency module 110 shown in FIG. 4 is formed from an HPA (High Power Amplifier) section 111, a high-frequency IC section 122, and a base band LSI section 113. The HPA section 111 is formed from a switch circuit 116 for switching transmission and reception and electrically connected to an antenna 115 for transmitting and receiving signal waves and a power amplification module 117 for amplifying the transmitted signal. The power amplification module 117 corresponds to the above-described RF power module 1. The high-frequency IC section 112 comprises a high-frequency filter 118 for removing the unnecessary waves from the received signal, an LNA (Low Noise Amplifier) 119 for amplifying the received signal, a PGA (Programmable Gain Amplifier) 120, a digital controlled crystal oscillator (DCXO) 121, an RFVCO (Radio Frequency Voltage Controlled Oscillator) 122, an output control unit 123, a VGA (Variable Gain Amplifier) 124, a modulation circuit 125, and a regulator 126. Furthermore, the LNS 119 is formed from an amplifier 119A and a demodulation circuit 119B.

A process for the manufacture of the semiconductor device (corresponds to the above-described semiconductor chip 2) of the present embodiment and the structure thereof will be explained below with reference to the drawings. FIGS. 5 to 19 are cross-sectional views of the main portions in the process for the manufacture of the semiconductor device (corresponds to the above-described semiconductor chip 2) of the present embodiment.

Figure 5:
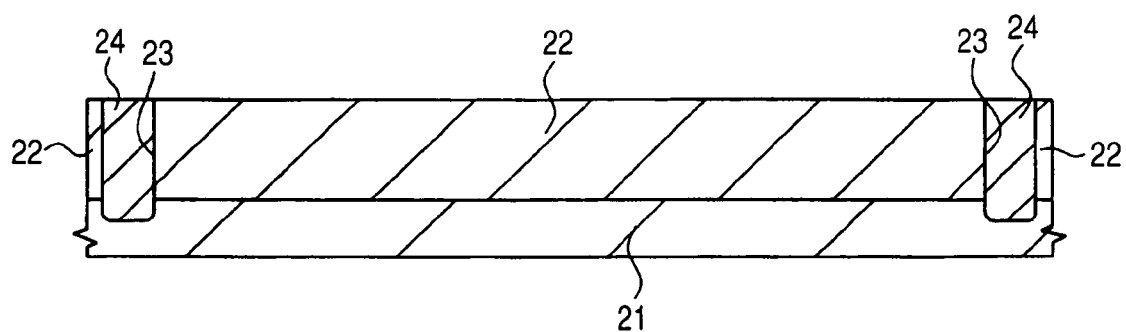
FIG. 5 is a cross-sectional view of the main portion in the process for the manufacture of a semiconductor device of one embodiment of the present invention.

First, as shown in FIG. 5, a semiconductor substrate (simply referred to hereinbelow as "substrate") 21 is prepared, this substrate comprising, for example, a $p^+$-type silicon (Si) single crystal and serving as a low-resistance substrate with an electric resistance (specific resistance) of, for example, about 1-10 mΩ·cm. Then, an epitaxial layer 22 comprising a p-type signal-crystal silicon with a film thickness of about 2 μm and an electric resistance (specific resistance) of, for example, about 20 mΩ·cm is formed by using a well-known epitaxial film growing method on the main surface of the substrate (semiconductor substrate, semiconductor wafer) 21. The concentration of dopants in the epitaxial layer 22 is lower than that in the substrate 21, and the resistance of the epitaxial layer 22 is higher than the resistance of the substrate 21.

Then, part (punching layer formation region) of the epitaxial layer 22 is etched by using a photolithography technology or dry etching technology and a groove 23 reaching the substrate 21 is formed. A p-type polycrystalline silicon film is then deposited so as to be embedded in the groove 23 by using a CVD (Chemical Vapor Deposition) method on the substrate 21 comprising the inner portion of the groove 23, and then the p-type polycrystalline silicon film located outside the groove 23 is removed by an etch-back method or the like to form a p-type punching layer 24 comprising the p-type polycrystalline silicon film inside the groove 23. The p-type punching layer 24 passes through the epitaxial layer 22, and the bottom portion of the p-type punching layer 24 reaches the substrate 21. Thus, the p-type punching layer 24 with a low parasitic resistance can be formed by burying the p-type polycrystalline silicon film doped with a dopant inside the groove 23. A punching layer with even lower parasitic resistance can be formed by burying a metal film inside the groove 23 instead of the polycrystalline silicon film. Furthermore, when the punching layer with a low parasitic resistance is not required, the p-type punching layer 24 may be formed by ion implanting a p-type dopant with a high concentration and a high energy. Then, an element separation region (not shown in the figure) comprising an insulator is formed on the main surface of the epitaxial layer 22, for example, by an STI (Shallow Trench Isolation) method or an LOCOS (Local Oxidization of Silicon) method.

Figure 6:
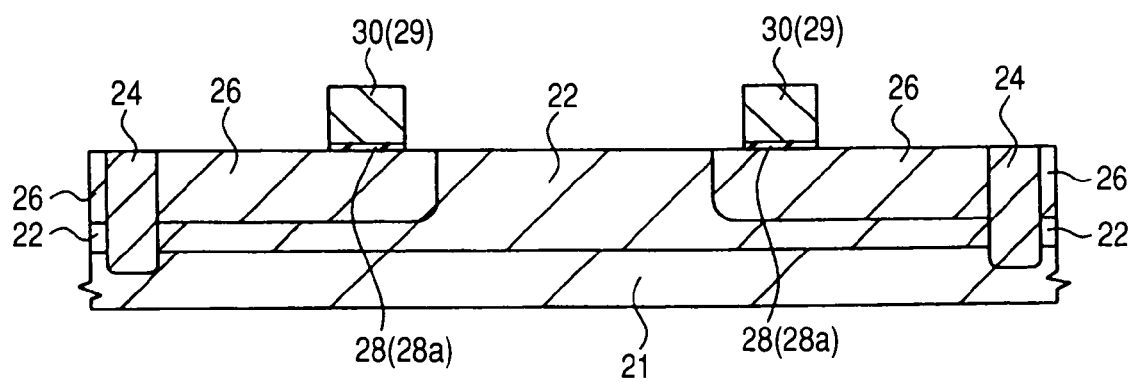
FIG. 6 is a cross-sectional view of the main portion in the process for the manufacture of a semiconductor device that follows the process shown in FIG. 5.

Then, as shown in FIG. 6, a p-type well 26 for a punch-through stopper is formed by ion implanting a p-type dopant such as boron (B) into part of the epitaxial layer 22 by using a photoresist pattern (not shown in the figure) as a mask. The p-type well 26 is formed in part of the LDMOSFET formation region; it is mainly formed in the source formation region and channel formation region of the LDMOSFET. Further, the p-type well 26 is also used for threshold adjustment of the LDMOSFET.

The surface of the epitaxial layer 22 is then washed with hydrofluoric acid or the like and the substrate 21 is thereafter heat treated (thermal oxidation treatment), for example, at a temperature of 800° C., thereby forming an insulating film 28a for forming a gate insulating film, for example, composed of a silicon oxide film with a thickness of about 11 nm on the surface of the epitaxial layer 22. The insulating film 28a may also employ a silicon oxide film comprising nitrogen, that is, the so-called oxynitride film instead of the thermal oxidation film. In this case, the number of photoelectron traps on the interface of the insulating film 28a can be reduced. Furthermore, it is also possible to deposit a silicon oxide film by a CVD method on top of the thermal oxidation film and to constitute the insulating film 28a of those two oxidation films.

Gate electrodes 30 are then formed on top of the insulating film 28a. The gate electrodes 30 comprise a silicon film, for example, an n-type polycrystalline silicon film (polycrystalline silicon film doped (implanted) with an n-type dopant such as phosphorus (P). For example, the gate electrodes 30 comprising the patterned n-type polysilicon film 29 can be formed on the surface of the p-type wells 26 via the insulating films 28a by depositing the n-type polysilicon film 29 with a film thickness of, for example, about 250 nm by a CVD method or the like on the main surface (that is, on the insulating film 28a) of the epitaxial layer 22 and patterning the n-type polysilicon film 29 by using a photolithography technology and dry etching technology. The insulating films 28a below the gate electrodes 30 serve as gate insulating films 28 of the LDMOSFET.

Figure 7:
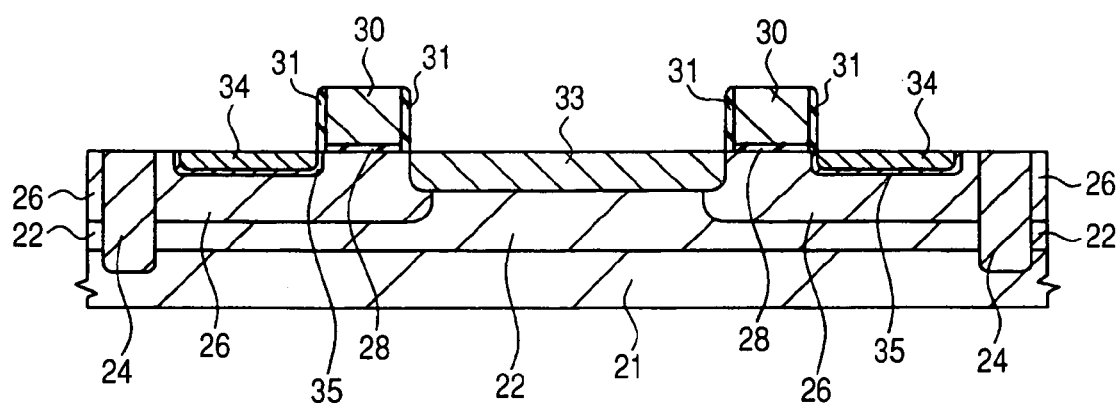
FIG. 7 is a cross-sectional view of the main portion in the process for the manufacture of a semiconductor device that follows the process shown in FIG. 6.

Then, as shown in FIG. 7, a side wall insulating film (side wall spacer) 31 comprising an insulating film such as silicon oxide film is formed on the side wall of the gate electrode 30. The side wall insulating film 31 can be formed, for example, by depositing a silicon oxide film (insulating film) with a thickness of, for example, about 20-30 nm, by a CVD method on the substrate 21 and then anisotropically etching the silicon oxide film (insulating film).

Then, an n⁻-type offset drain region (n⁻type semiconductor region) 33 is formed by ion implanting an n-type dopant such as phosphorus (P) on part of the epitaxial layer 22 of the LDMOSFET formation region 21A by using a photoresist pattern (not shown in the figure) as a mask. The n⁻-type offset drain region 33 is formed with self-alignment against the side wall insulating film 31 located on the side wall of the gate electrode 30 on the drain side thereof.

The n⁻-type offset drain region 33 ends below the side wall insulating film 31 so that the end portion thereof is in contact with the channel formation region. If the dopant concentration of the n⁻-type offset drain region 33 is decreased, a depleted layer expands between the gate electrode 30 and the drain. Therefore, the feedback capacitance (parasitic capacitance between the drain and gate electrode, Cgd) formed between the two is reduced. Furthermore, the formation of the side wall insulating film 31 can be omitted and the n⁻-type offset drain region 33 can be formed by aligning with the gate electrode 30, but when the n⁻-type offset drain region 33 is formed after the formation of the side wall insulating film 31 on the side wall of the gate electrode 30 as described hereinabove, then the breakdown voltage at the end portion of the gate electrode 30 can be further increased.

Then, an n-type source region (n-type semiconductor region) 34 is formed by ion implanting an n-type dopant such as arsenic (As) into the front surface of the p-type well 26 by using a photoresist pattern (not shown in the figure) as a mask. The n-type source region 34 is formed with self alignment against the side wall insulating film 31 located on the side wall of the gate electrode 30 on the source side thereof.

The n-type source region 34 ends below the side wall insulating film 31 so that the end portion thereof is in contact with the channel formation region. When a comparatively shallow n-type source region 34 is formed, the spread of the dopant from the source to the channel formation region can be inhibited. Therefore, the decrease in the threshold voltage can be suppressed.

Then, following ion implantation for the formation of the n-type source region 34, a p-type halo region 35 is formed below the n-type source region 34 by ion implanting a p-type dopant such as boron (B) into the front surface of the p-type well 26. When this p-type halo region 35 is formed, an inclined ion implantation method is used by which a dopant is ion implanted from the direction inclined with respect to the main surface of the substrate 21. It is not always necessary to form the p-type halo region 35, but when it is formed, the spread of the dopant from the source into the channel formation region can be further inhibited and a short-channel effect can be further suppressed. Therefore, the decrease in the threshold voltage can be further suppressed.

Figure 8:
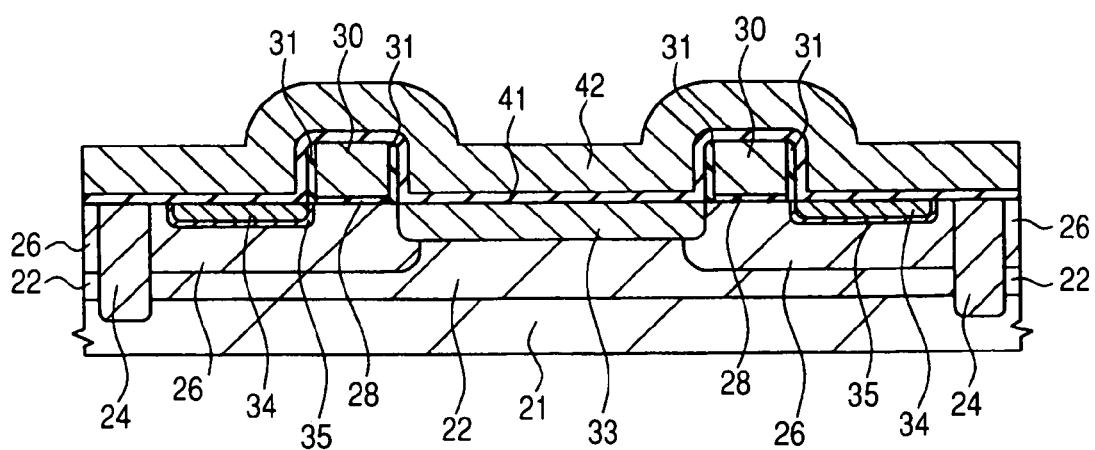
FIG. 8 is a cross-sectional view of the main portion in the process for the manufacture of a semiconductor device that follows the process shown in FIG. 7.

Then, as shown in FIG. 8, an insulating film 41 is formed on the substrate 21 so as to cover the gate electrode 30. The insulating film 41 is formed, for example, from a silicon oxide film, and the thickness thereof, for example, can be about 40 nm. This insulating film 41 is formed to provide electric insulation between a field plate electrode 44 formed from the below-described silicon film 42 and the drain of the LDMOSFET.

Then, a silicon film (conductor film) 42 is formed as a conductor film on the substrate 21, that is, on the insulating film 41. The silicon film 42 is preferably an amorphous silicon film or a low-resistance polycrystalline silicon film (doped polysilicon film) having n-type or p-type dopant introduced therein. When the silicon film 42 is formed from an amorphous silicon film, the film that was an amorphous silicon film during film formation can become a polycrystalline silicon film in the course of various high-temperature processes (for example, a process in which the substrate temperature becomes high, for example, an activation annealing process conducted after ion implantation) conducted thereafter. The thickness (film thickness) of the silicon film 42 can be comparatively large, for example, about 200 nm.

Figure 9:
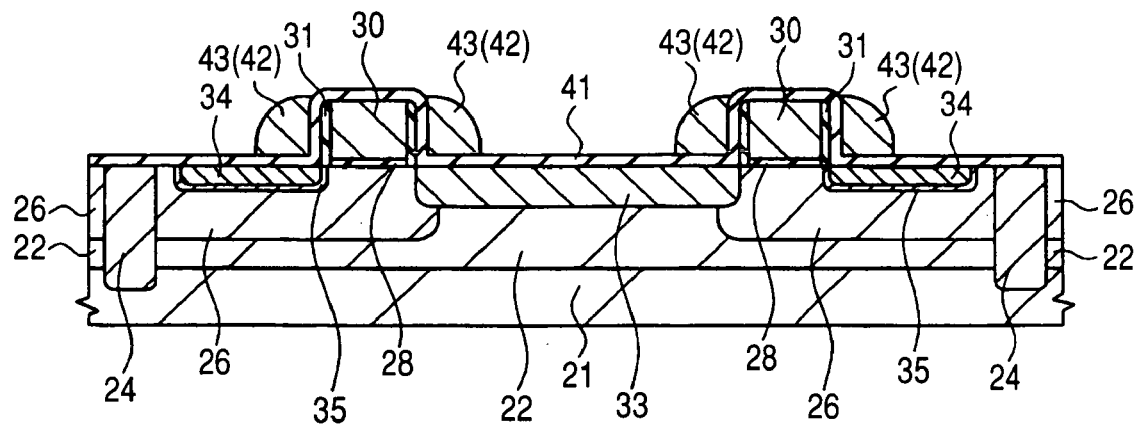
FIG. 9 is a cross-sectional view of the main portion in the process for the manufacture of a semiconductor device that follows the process shown in FIG. 8.

Then, as shown in FIG. 9, the silicon film 42 is left via an insulating films (side wall insulating film 31 and insulating film 41) on the side surface (side wall) of the gate electrode 30 and the silicon film 42 in other areas is removed by conducting etch back by anisotropically etching the silicon film 42. As a result, a side wall spacer (side wall) 43 comprising a silicon film 42 is formed on the side surface (side wall) of the gate electrode 30. The side wall spacer 43 comprising the silicon layer 42 is formed via the side wall insulating film 31 and the insulating film 41 on both side surfaces (side walls), that is, on the drain side and source side of the gate electrode 30. Of the two spacers, the wall spacer 43 located on the side surface (side wall) of the gate electrode 30 on the drain side thereof serves as the field plate electrode 44. When anisotropic etching (etch back) of the silicon film 42 is conducted, the silicon film 42 located on the upper surface of the gate electrode 30 is completely removed and the insulating film 41 located on the upper surface of the gate electrode 30 is exposed. Furthermore, when anisotropic etching (etch back) of the silicon film 42 is conducted, a photoresist layer is not formed on the region outside the lead-out portion 44a of the below-described field plate electrode 44.

Figure 10:
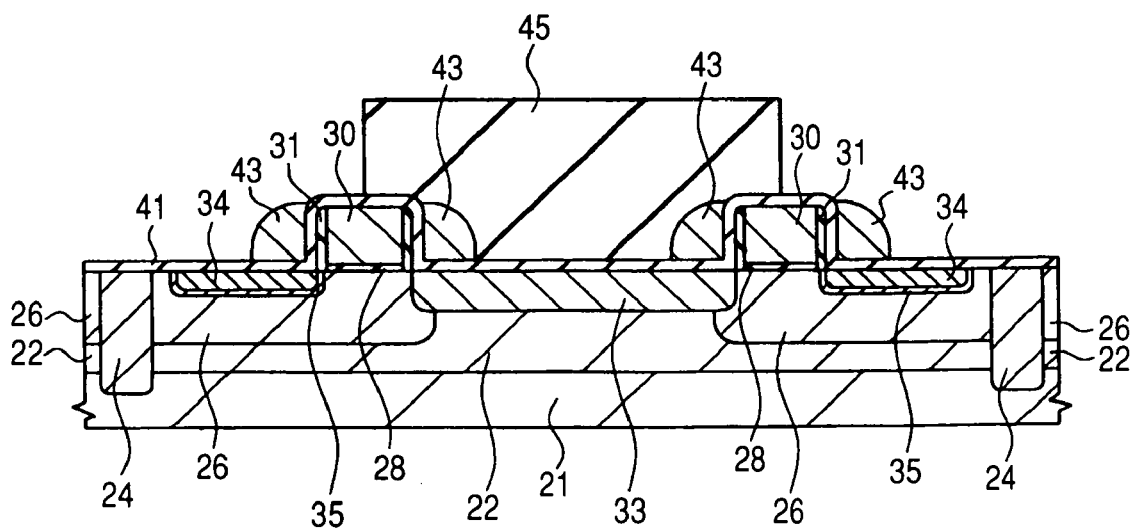
FIG. 10 is a cross-sectional view of the main portion in the process for the manufacture of a semiconductor device that follows the process shown in FIG. 9.

Then, as shown in FIG. 10, a photoresist pattern (photoresist layer, etching mask layer) 45 is formed on the substrate 21 by using a photolithography method. The photoresist pattern 45 is formed so as to cover the side wall spacer 43 located on the side wall of the gate electrode 30 on the drain side thereof and to expose the side wall spacer 43 located on the side wall of the gate electrode 30 on the source side thereof. For this purpose, the end portion of the photoresist pattern 45 is positioned on the gate electrode 30.

Figure 11:
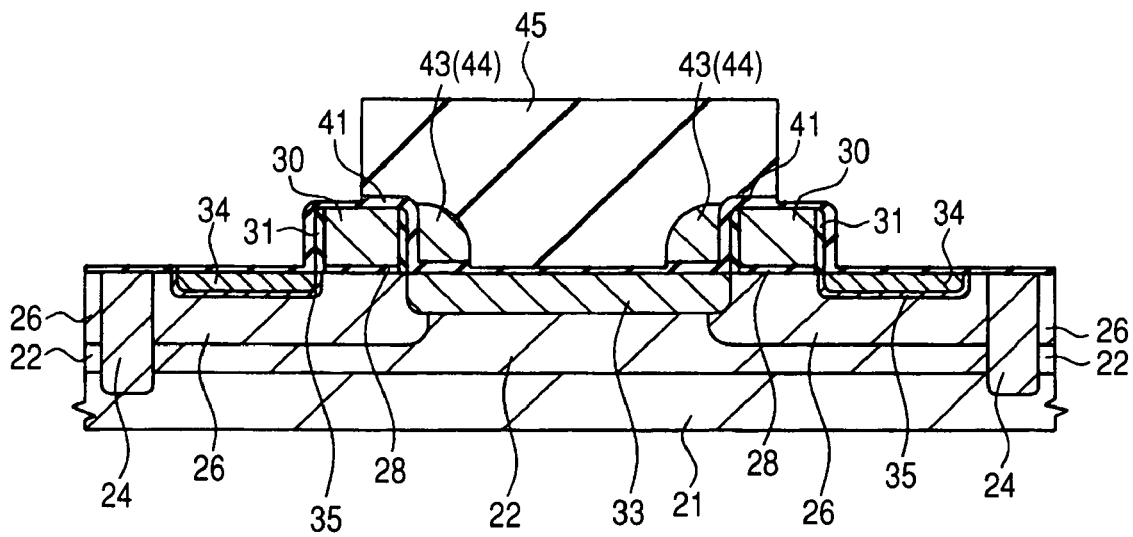
FIG. 11 is a cross-sectional view of the main portion in the process for the manufacture of a semiconductor device that follows the process shown in FIG. 10.

Then, as shown in FIG. 11, the side wall spacer 43 located on the side wall of the gate electrode 30 on the source side thereof is removed by dry etching by using the photoresist pattern 45 as an etching mask. At this time, because the side wall spacer 43 located on the side wall of the gate electrode 30 on the drain side thereof is covered with the photoresist pattern 45, it is not etched and remains. Furthermore, the insulating film 41 located on the side wall of the gate electrode 30 on the source side thereof also remains. The side wall spacer 43 composed of the silicon film 42 remaining on the side wall of the gate electrode 30 on the drain side thereof becomes the field plate electrode 44. Therefore, the field plate electrode 44 comprising the side wall spacer 43 formed by conducting etch back of the silicon film 42, that is, the field plate electrode 44 with a side wall spacer shape (side wall shape) is formed on the side wall of the gate electrode 30 on the drain side thereof via the side wall insulating film 31 and the insulating film 41. Furthermore, in the course of dry etching of the side wall spacer 43 on the source side that uses the photoresist pattern 45, the insulating film 41 located on the n-type source region 34 can be completely removed and the surface of the n-type source region 34 can be exposed. However, it is preferred that the insulating film 41 be caused to act as an etching stopper film and the insulating film 41 of reduced film thickness be left on the n-type source region 34, because such as approach can prevent the substrate (n-type source region 34) from damage. The photoresist pattern 45 is then removed.

Figure 12:
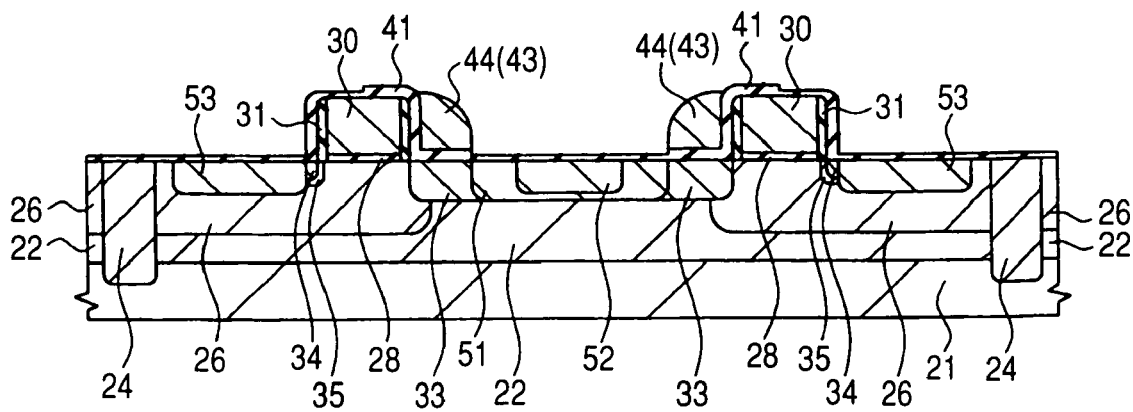
FIG. 12 is a cross-sectional view of the main portion in the process for the manufacture of a semiconductor device that follows the process shown in FIG. 11.

Then, as shown in FIG. 12, an n-type dopant such as phosphorus (P) is ion implanted in part of the n⁻-type offset drain region 33. As a result, an n-type offset drain region (n-type semiconductor region) 51 is formed in part of the n⁻-type offset drain region 33 so as to be self aligned with the field plate electrode 44 (side wall spacer 43) formed on the side wall of the gate electrode 30 on the drain side thereof.

If the acceleration energy of ion implantation is the same in the ion implantation process for forming the n⁻-type offset drain region 33 and the ion implantation process for forming the n-type offset drain region 51, the junction depth of the n-type offset drain region 51 becomes almost equal to the junction depth of the n⁻-type offset drain region 33. Furthermore, because the dopants implanted into the n-type offset drain region 51 are of the same conductivity type (here, n type) as the dopants implanted into the n⁻-type offset drain region 33, the concentration of dopants in the n-type offset drain region 51 becomes higher than the concentration of dopants in the n⁻-type offset drain region 33. Furthermore, the n⁻-type offset drain region 33 is formed with self alignment against the side wall insulating film 31, whereas the n-type offset drain region 51 is formed with self alignment against the field plate electrode 44 (sidewall spacer 43). Therefore, the n-type offset drain region 51 is formed with a separation from the channel region that corresponds to the combined thickness of the insulating film 41 and the field plate electrode 44 (side wall spacer 43) along the longitudinal direction of the gate.

Then, an n-type dopant such as arsenic (As) is ion implanted in both the n-type offset drain region 51 and the p-type well 26 by using as a mask a photoresist pattern (not shown in the figure) having openings above part of the n-type offset drain region 51 and the p-type well 26 in the source formation region. As a result, an n⁺-type drain region (n⁺-type semiconductor region) 52 with a dopant concentration higher than that of the n-type offset drain region 51 and located farther from the channel formation region than the n-type offset drain region 51 is formed in part of the n-type offset drain region 51, and an n⁺-type source region (n⁺-type semiconductor region) 53 with a dopant concentration higher than that of the n-type source region 34 and the position of the bottom portion (junction depth) deeper than that of the n-type source region 34 is formed in the p-type well 26. In this process, the n⁺-type source region 53 is formed with self alignment with respect to the insulating film 41 located on the side wall of the gate electrode 30 on the source side thereof and formed in contact with the n-type source region 34. Therefore, the n⁺-type source region 53 is formed with a separation from the channel formation region that corresponds to the thickness of the insulating film 41 along the longitudinal direction of the gate.

In the preceding processes, a MISFET (Metal Insulator Semiconductor Field Effect Transistor) such as LDMOSFET (Laterally Diffused Metal-Oxide-Semiconductor Field Effect Transistor, laterally diffused MOSFET) having a drain (drain region) comprising the n⁻-offset drain region 33, the n-type offset drain region 51, and the n⁺-drain region 52 and a source (source region) comprising the n-type source region 34 and the n⁺-type source region 53 is formed on the main surface of the epitaxial layer 22 on the substrate 21. The MOSFET of the present embodiment includes not only a MISFET using an oxidation film (silicon oxide film) for the gate insulating film, but also MISFETs using an insulating film other than the oxidation film (silicon oxide film) for the gate insulating film. Further, the LDMOSFET formed herein on the epitaxial layer 22 on the substrate 21 is an LDMOSFET constituting amplification stages 102A1-102A3, 102B1-102B3 of the above-described power amplification circuits 102A, 102B.

Further, as described hereinabove, the field plate electrode 44 comprising a side wall spacer 43 formed by etching the silicon film 42, that is, the field plate electrode 44 with a side wall spacer shape, is formed via the side wall insulating film 31 and the insulating film 41 on the side surface (side wall) of the gate electrode 30 on the drain side thereof. The field plate electrode 44 and the drain (n⁻-offset drain region 33) of the LDMOSFET are insulated from each other with the insulating film 41 introduced therebetween, and the field plate electrode 44 and the gate electrode 30 of the LDMOSFET are insulated from each other with the insulating film 31 and the insulating film 41 introduced therebetween.

Figure 13:
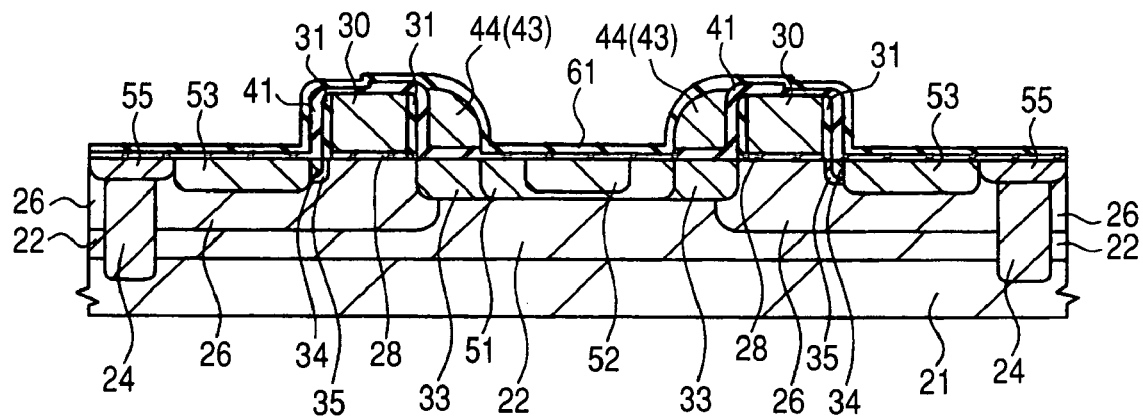
FIG. 13 is a cross-sectional view of the main portion in the process for the manufacture of a semiconductor device that follows the process shown in FIG. 12.

Then, as shown in FIG. 13, a p-type dopant such as boron fluoride (BF₂) is ion implanted into the surface of the p-type punching layer 24 by using as a mask a photoresist pattern (not shown in the figure) having an opening above the p-type punching layer 24. As a result, a p⁺-type semiconductor region 55 is formed on the upper region of the p-type punching layer 24. By forming the p+-type semiconductor region 55 on the upper region of the p-type punching layer 24, it is possible to reduce the electric resistance of the surface of the p-type punching layer 24.

An insulating film 61 is then formed on the substrate 21. Thus, the insulating film 61 is formed so as to cover the source, drain, and the gate electrode 30 of the LDMOSFET and the field plate electrode 44. The insulating film 61 comprises, for example, a silicon oxide film, and the thickness thereof can be, for example, about 20 nm. The insulating film 61 serves to prevent the formation of a metal silicide film 64 on the drain of the LDMOSFET in the below-described silicide process.

Figure 14:
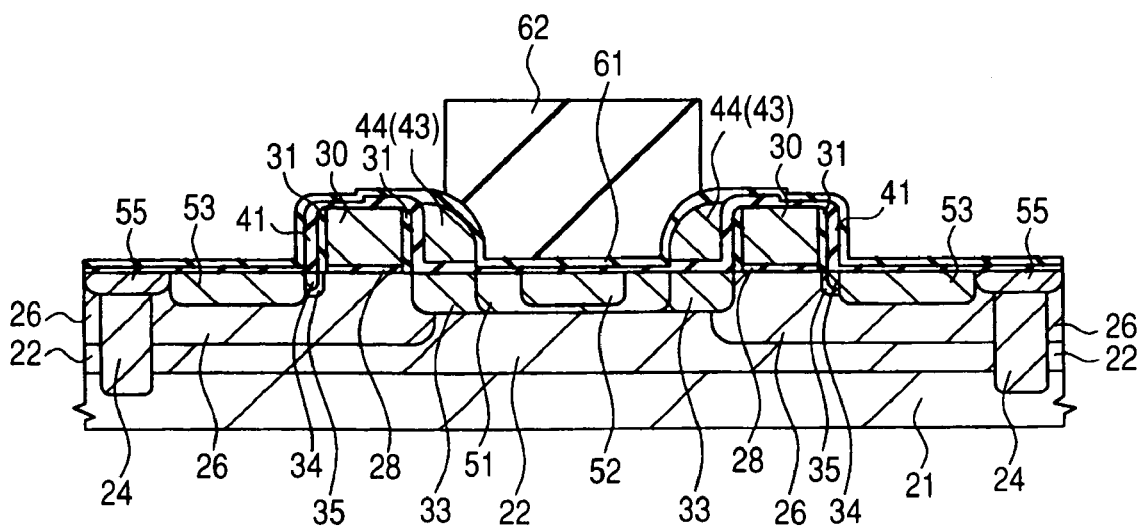
FIG. 14 is a cross-sectional view of the main portion in the process for the manufacture of a semiconductor device that follows the process shown in FIG. 13.

Then, as shown in FIG. 14, a photoresist pattern (photoresist layer, etching mask layer) 62 is formed on the substrate 21, that is, over the insulating film 61, by using a photolithography method. The photoresist pattern 62 is formed to cover the n-type offset drain region 51 and the n+-drain region 52 and not to cover the n+-type source region 53 and the gate electrode 30. In the present embodiment, the end portion of the photoresist pattern 62 is positioned over the field plate electrode 44 (side wall spacer 43). As a result, the end portion of the photoresist pattern 62 is not positioned on the gate electrode 30.

Figure 15:
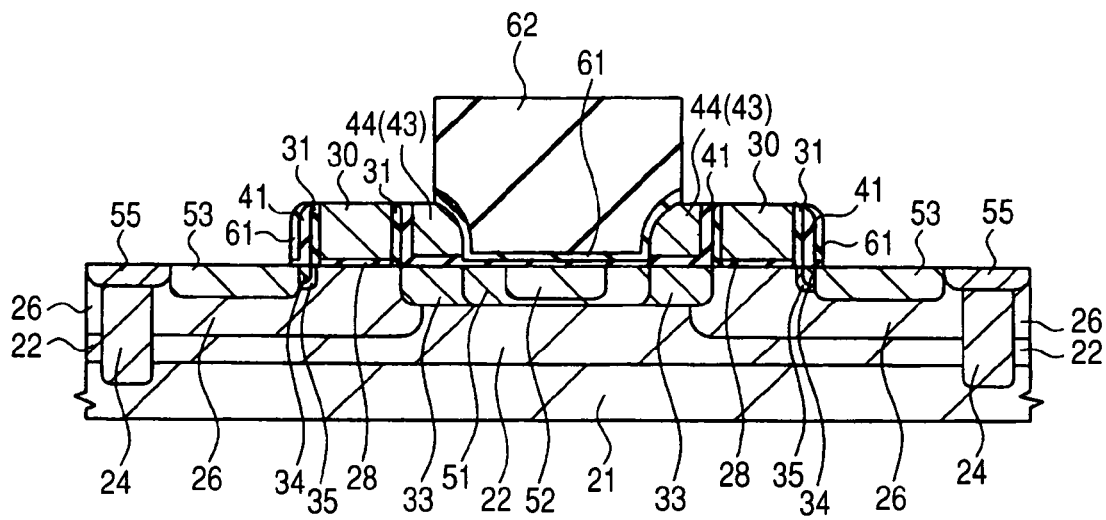
FIG. 15 is a cross-sectional view of the main portion in the process for the manufacture of a semiconductor device that follows the process shown in FIG. 14.

Then, as shown in FIG. 15, the exposed insulating film 61 (and the insulating film 41 located therebelow) is selectively removed by dry etching by using the photoresist pattern 62 as an etching mask. In this dry etching process, the insulating film 61 located on the n-type offset drain region 51 and the n+-type drain region 52 is not etched and remains because it is covered by the photoresist pattern 62. In this dry etching process, because the n+-type source region 53 and gate electrode 30 are not covered with the photoresist pattern 62, the insulating films (insulating film 61 and insulating film 41) located on the n+-type source region 53 and the gate electrode 30 are removed and the upper surfaces of the n+-type source region 53 and the gate electrode 30 are exposed. Because the end portion of the photoresist pattern 62 is positioned on the field plate electrode 44 and is not positioned on the gate electrode 30, the entire upper surface of the gate electrode 30 is exposed. Further, because the insulating film 61 located on the region of the field plate electrode 44 that was not covered with the photoresist pattern 62 is also removed, part of the field plate electrode 44 (upper surface of the end portion on the side close to the gate electrode 30) is also exposed. Furthermore, in the dry etching process, the side wall insulating film 31 located on the side wall of the gate electrode 30 on the drain side thereof, the insulating film 41, the field plate electrode 44, the side wall insulating film 31 located on the side wall of the gate electrode 30 on the source side thereof, and the insulating film 41 remain unetched. The photoresist pattern 62 is thereafter removed.

Figure 16:
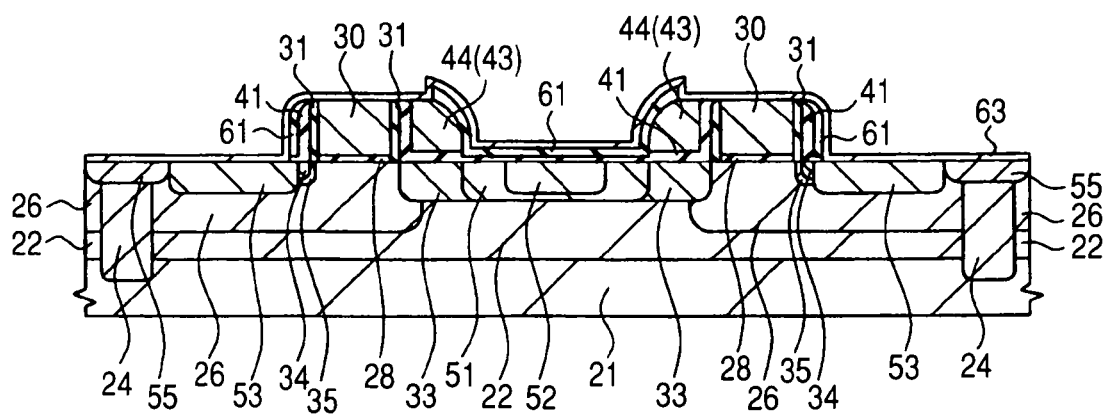
FIG. 16 is a cross-sectional view of the main portion in the process for the manufacture of a semiconductor device that follows the process shown in FIG. 15.

Then, as shown in FIG. 16, a metal film 63 is formed on the substrate 21 including the upper surface of the exposed n+-type source region 53 and the gate electrode 30. The metal film 63 comprises, for example, a cobalt (Co) film. Because the metal film 63 is formed in a state in which the upper surfaces of the n+-type source region 53 and the gate electrode 30 are exposed, and the drain region (n−-type offset drain region 33, n-type offset drain region 51, and n+-type drain region 52) is covered with the insulating film 41, the field plate electrode 44, and the insulating film 61, the metal film 63 is in contact with the upper surface of the n+-type source region 53 and the gate electrode 30, but the metal film 63 is not in contact with the drain region (n−-offset drain region 33, n-type offset drain region 51, and n+-type drain region 52). Further, the upper surface of the end portion of field plate electrode 44 on the side close to the gate electrode 30 is also in contact with the metal film 63.

Figure 17:
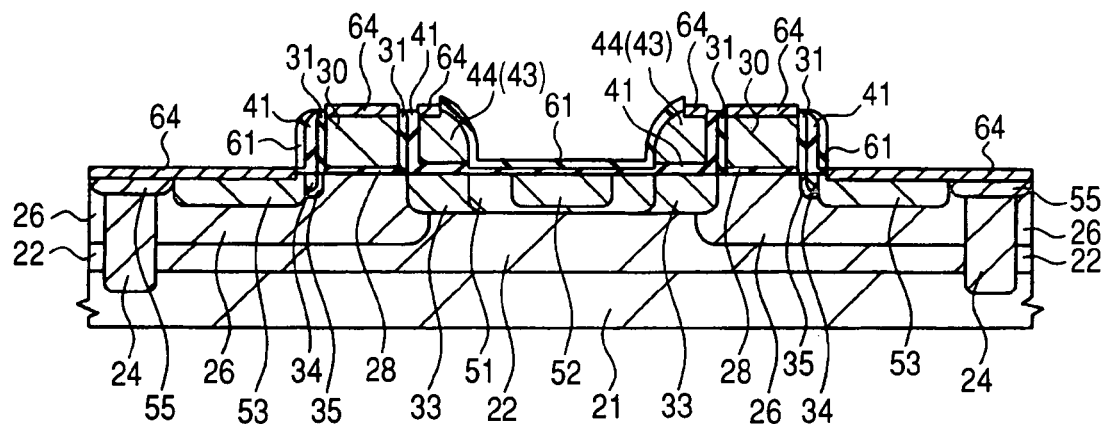
FIG. 17 is a cross-sectional view of the main portion in the process for the manufacture of a semiconductor device that follows the process shown in FIG. 16.

The reaction between the silicon (Si) element of the n+-type source region 53 and the gate electrode 30 and the metal element (for example, Co) of the metal film 63 is then induced by conducting a heat treatment. As a result, a metal silicide film 64 can be selectively formed on the surface (top portion) of the n+-type source region 53 and the gate electrode 30. In this process, because the field plate electrode 44 is formed from a silicon film 42, the metal silicide film 64 is also formed on part (upper surface of the end portion on the side close to the gate electrode 30) of the field plate electrode 44 that was brought into contact with the metal film 61. Then, the unreacted metal film (for example, cobalt film) 63 is removed. FIG. 17 shows the state after the metal silicide film 64 was formed and the unreacted metal film 63 was removed.

By forming the metal silicide film 64 on the surface (top portion) of the n+-type source region 53 and the gate electrode 30, it is possible to reduce the diffusion resistance or contact resistance of the n+-type source region 53 and the gate electrode 30. Furthermore, because the metal silicide film 64 is also formed on the surface (top portion) of the part (region in the vicinity of the end portion on the side close to the gate electrode 30) of the field plate electrode 44, the diffusion resistance or contact resistance of the field plate electrode 44 can be reduced.

Thus, in the present embodiment, the metal silicide film 64 is formed on the surface (top portion) of part of the field plate electrode 44 (side wall spacer 43) and the surface (top portion) of the gate electrode 30 and the n+-source region 53 of the LDMOSFET by using a silicides process. Therefore, the metal silicide film 64 formed on the surface (top portion) of the n+-type source region 53 of the LDMOSFET, the metal silicide film 64 formed on the surface (top portion) of the gate electrode 30, and the metal silicide film 64 formed on the surface (top portion) of the field plate electrode 44 comprise a metal silicide of the same type (for example, cobalt silicide).

Furthermore, in the present embodiment, the metal silicide film 64 is formed on the surface (top portion) of part of the field plate electrode 44 and the surface (top portion) of the gate electrode 30 and source (n+-type source region 53) of the LDMOSFET, but the metal silicide film 64 is not formed on the surface (top portion) of the drain (n−-type offset drain region 33, n-type offset drain region 51, and n+-type drain region 52) of the LDMOSFET. Further, in the present embodiment, the entire upper surface of the gate electrode 30 can be exposed by positioning the end portion of the photoresist pattern 62 on the field plate electrode 44, and because the metal silicide film 64 is thereafter formed by conducting the deposition of the metal film 63 and heat treatment, the metal silicide film 64 can be formed over the entire top surface of the gate electrode 30.

Figure 18:
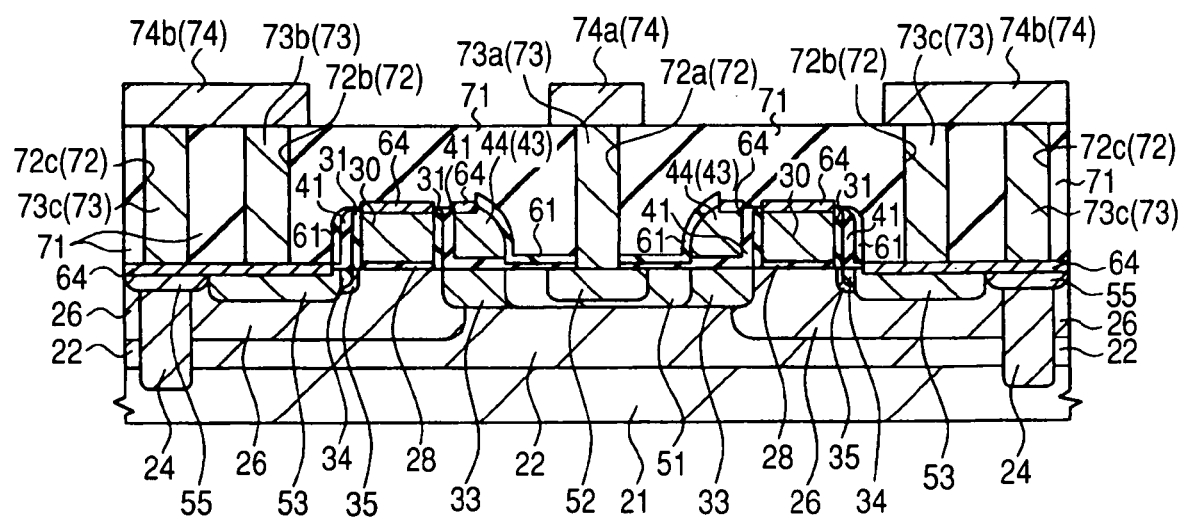
FIG. 18 is a cross-sectional view of the main portion in the process for the manufacture of a semiconductor device that follows the process shown in FIG. 17.

Then, as shown in FIG. 18, an insulating film (interlayer insulating film) 71 is formed, for example, by using a CVD method, on the substrate 21. After the formation of the insulating film 71, the surface of the insulating film 71 is flattened, if necessary, by conducting CMP (Chemical Mechanical Polishing). The insulating film 71 comprises, for example, a relatively thin silicon nitride film and a relatively thick silicon oxide film located thereupon. The silicon nitride film of the lower layer can function as an etching stopper film during the formation of the below-described contact hole 72. Furthermore, a single-layer film such as a silicon oxide film also can be used as the insulating film 71.

Then, contact holes (opening) 72 are formed in the insulating film 71 by dry etching the insulating film 71 by using a photoresist pattern (not shown in the figure) as an etching mask. The contact holes 72 are formed above the drain (n$^+$-type drain region 52), source (n$^+$-type source region 53), and the p-type punching layer 24 (p$^+$-type semiconductor region 55) of the LDMOSFET. Further, in the cross-sectional view that is not shown in the figure, the contact holes 72 are also formed above a lead-out portion (the below-described lead-out portion 30a) of the gate electrode 30 and a lead-out portion (the below-described lead-out portion 44a) of the field plate electrode 44.

Then, a plug (conductor portion, contact layer) 73 based on a tungsten (W) film is embedded in a contact hole 72. For example, after a barrier film (for example, a titanium nitride film) has been formed on the insulating film 71 comprising the internal portion (on the bottom or side wall) of the contact holes 72, plugs 73 can be formed by forming a tungsten film by a CVD method or the like on the barrier film so as to fill the contact holes 72 and then removing the unnecessary tungsten film and barrier film located on the insulating film 71 by a CMP method or etch back method. The plugs 73 filling up the contact holes 72 are electrically connected, at the bottom portions of the contact holes 72, to the n$^+$-type drain region 52, the n$^+$-type source region 53, and the p-type punching layer 24 (p$^+$-type semiconductor region 55) of the LDMOSFET. Thus, a plug 73a filling up a contact hole 72a of the contact holes 72 is electrically connected, at the bottom portion of the contact hole 72a, to the n$^+$-type drain region 52 of the LDMOSFET. A plug 73b filling up a contact hole 72b of the contact holes 72 is electrically connected, at the bottom portion of the contact hole 72b, to the n$^+$-type source region 53 of the LDMOSFET. A plug 73c filling up a contact hole 72c of the contact holes 72 is electrically connected, at the bottom portion of the contact hole 72c, to the p-type punching layer 24 (p$^+$-type semiconductor region 55) of the LDMOSFET. Further, in the cross-sectional view that is not shown in the figure, the plug 73 filling up the contact hole 72 (corresponds to the below-described contact holes 72d) is electrically connected to the gate electrode 30, and the plug 73 connected to the contact hole 72 (corresponds to the below-described contact hole 72e) is electrically connected to the field plate electrode 44.

Then, a wiring (first-layer wiring) 74 comprising a conductor film based, for example, on an aluminum (Al) alloy film is formed on top of the insulating film 71. The wiring 74 can be formed, for example, by forming an aluminum alloy film on the insulating film 71 an patterning this aluminum alloy film by a photolithography method and dry etching method. A drain electrode 74a and a source electrode 74b are formed with the wiring 74.

The drain electrode 74a is electrically connected to the drain (n$^+$-type drain region 52) of the LDMOSFET via the plug 73 filling up the contact hole 72a. The source electrode 74b is electrically connected to the source (n$^+$-type source region 53) of the LDMOSFET via the plug 73b filling up the contact hole 72b, electrically connected to the p-type punching layer 24 via the plug 73c filling up the contact hole 72c, and also electrically connected to the substrate 21 (and the below described rear surface electrode 81) via the p-type punching layer 24. Therefore, the source (n$^+$-type source region 53) of the LDMOSFET is electrically connected to the p-type punching layer 24 and further electrically connected to the substrate 21 (and the below described rear surface electrode 81) via the plugs 73 (73a, 73b) and the source electrode 74b.

Figure 19:
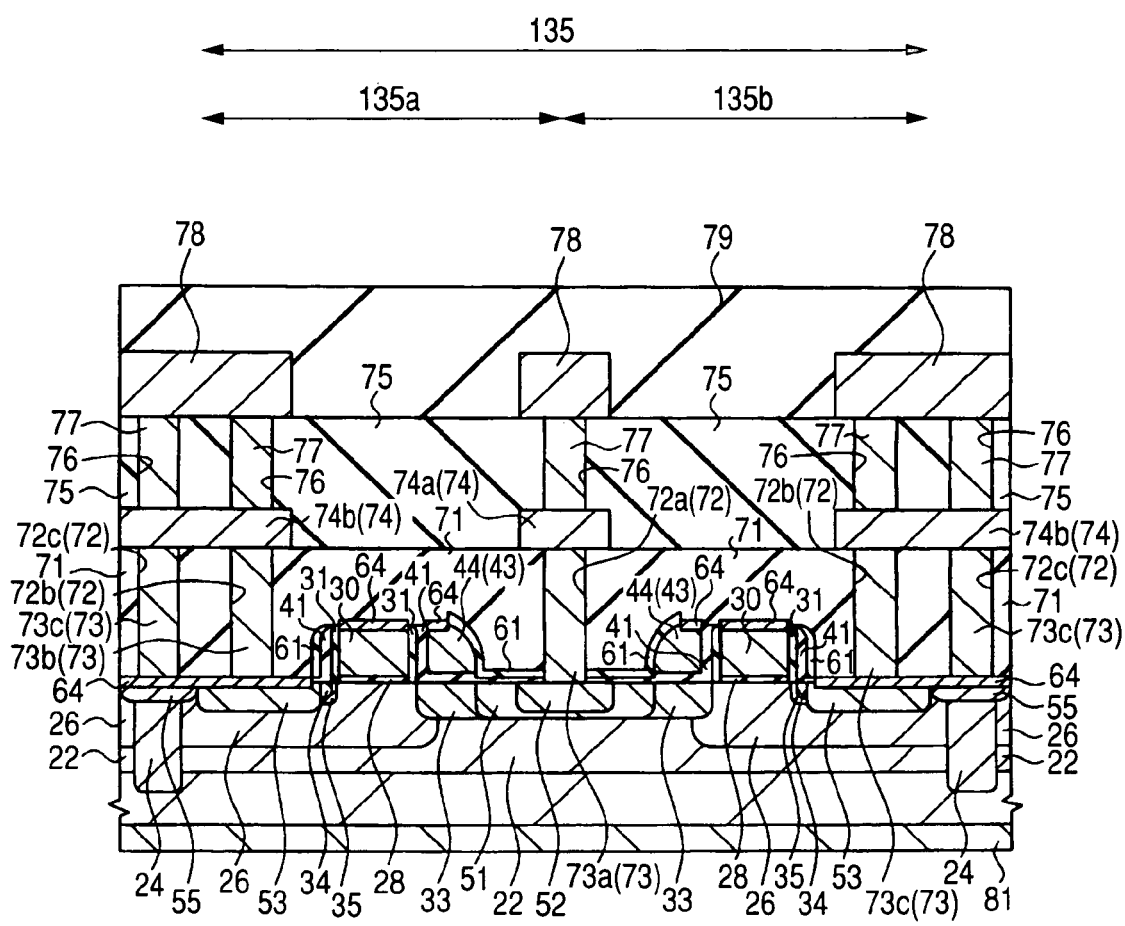
FIG. 19 is a cross-sectional view of the main portion in the process for the manufacture of a semiconductor device that follows the process shown in FIG. 18.

Then, as shown in FIG. 19, an insulating film 75 comprising a silicon oxide film is formed by a CVD method or the like on the insulating film 71 so as to cover the wiring 74 (drain electrode 74a and source electrode 74b), then continuously a through hole (open portion) 76 is formed by etching out part of the insulating film 75, and the inside of the through hole 76 is then filled up with a plug 77 based on a tungsten (W) film. Then, a conductor film based, for example, on an aluminum (Al) alloy film is formed on top of the insulating film 75 and this conductor film is patterned by using a photolithography method and dry etching method, thereby forming a wiring (second layer wiring) 78 composed of the patterned conductor film. The wiring 78 and the wiring 74 (wiring 78 and drain electrode 74a, wiring 78 and source electrode 74b) are electrically connected via the plug 77. In another mode, the wiring (second-layer wiring) 78 comprising a patterned conductor film can be also formed by forming the conductor film based, for example, on an aluminum (Al) alloy film on the insulating film 75, so as to fill up the through hole 76, without forming the plug 77, and then patterning this conductor film by using a photolithography method and dry etching method. In this case, part of the wiring 78 is embedded in the through hole 76 and electrically connected to the wiring 74 at the bottom of the through hole 76.

Then, a surface protective film 79 comprising a laminated film of a silicon oxide film and a silicon nitride film is formed on the insulating film 75 so as to cover the wiring 78. Then, part of the surface protective film 79 is selectively removed and part (a pad portion that is not shown in the figure) of the wiring 78 is exposed. The rear surface (main surface on side opposite that where the epitaxial layer 22 was formed) of the substrate 21 is thereafter polished, if necessary, and then a rear surface electrode (rear surface source electrode) 81 is formed on the entire rear surface of the substrate 21. The formation of the circuitry (amplification circuit comprising an LDMOSFET element constituting the amplification stages 102A1-102A3 and 102B1-102B3 of the power amplification circuits 102A, 102B) located inside the semiconductor chip 2 is almost completed by the above-described processes. The rear surface electrode 81 can be formed by successively depositing, for example, a nickel (Ni) film, a titanium (Ti) film, a nickel (Ni) film, and a gold (Au) film by a sputtering method. The rear surface electrode 81 is electrically connected to the source of the LDMOSFET via the p-type punching layer 24, the plug 73 (plugs 73a, 73b), and the source electrode 74a.

Then, the substrate 21 is divided into individual semiconductor chips (semiconductor chips 2) by dicing or the like and the chip is soldered to the wiring board 3 via the rear surface electrode 81 (that is, the rear surface electrode 2b), as shown in FIG. 2.

Figure 20:
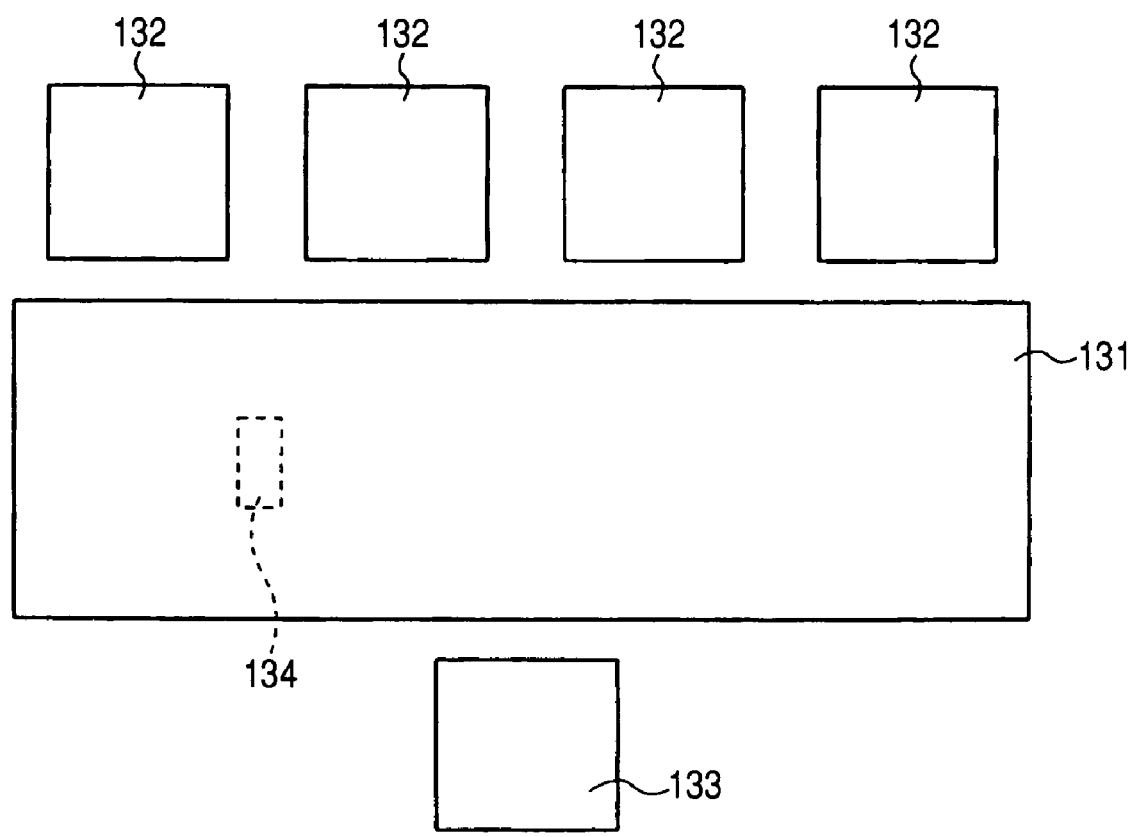
FIG. 20 is a plan layout view of the semiconductor device of one embodiment of the present invention.
Figure 21:
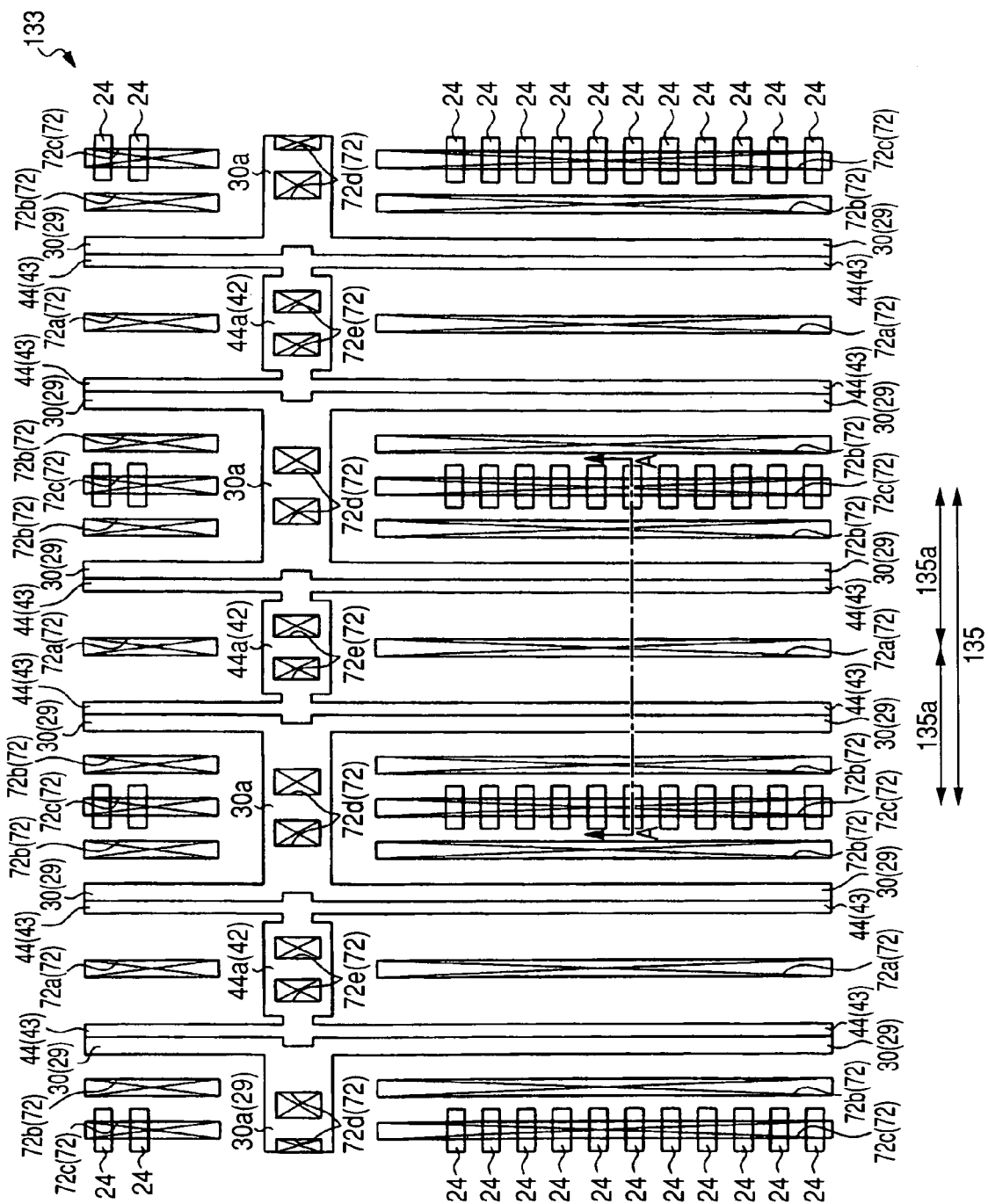
FIG. 21 is a plan view of the main portion of the semiconductor device of one embodiment of the present invention.

FIG. 20 is a conceptual layout view (plan view) of the semiconductor device (corresponds to the semiconductor chip 2) of the present embodiment. FIG. 21 is a plan view (partially enlarged plan view) of the main portion of the semiconductor device (corresponds to the semiconductor chip 2) of the present embodiment and shows a region corresponding to the region 134 shown in FIG. 20. The cross-sectional view along the line A-A in FIG. 21 almost corresponds to FIG. 19. Furthermore, in FIG. 21, a layout of the p-type punching layer 24, the gate electrode 30, the field plate electrode 44, and the contact holes 72 (contact holes 72a, 72b, 72c, 72d, 72e) is shown, whereas other structural elements are not shown in the figure to facilitate understanding.

As shown in FIG. 20, a drain pad (pad electrode, bonding pad 132) electrically connected to the drain electrode 74a and a gate pad (pad electrode, bonding pad) 133 electrically connected to the gate electrode 30 are disposed on the periphery of the LDMOSFET formation region 131, which is the region where the above-described LDMOSFET was formed. A drain voltage is applied to the drain (n⁺-type drain region 52) of the LDMOSFET formed in the LDMOSFET formation region 131 by applying a drain voltage to the drain pad 132 of the semiconductor device (semiconductor chip), and a gate voltage is applied to the gate electrode 30 of the LDMOSFET formed in the LDMOSFET formation region 131 by applying a gate voltage to the gate pad 133. Furthermore, a source voltage is applied to the source (n⁺-type source region 53) of the LDMOSFET formed in the LDMOSFET formation region 131 by supplying a source voltage (for example, a ground potential or fixed potential) to the rear surface electrode 81 (that is, rear surface electrode 2b).

In the LDMOSFET formation region 131, as shown in FIG. 21, the layout of unit cells (cyclic pitch) 135 is repeated. Two units LDMOSFET 135a are formed of one unit cell 135. FIG. 19 shows a cross-sectional view of one unit cell 135, that is, two unit LDMOSFET 135a. In the LDMOSFET formation region 131, a multiplicity (a plurality) of unit LDMOSFET 135a are formed by repeating the layout of the unit cell 135, and amplification stages 102A1-102A3, 102B1-102B3 are formed by connecting the multiplicity (plurality) of unit LDMOSFET 135a in parallel.

As described hereinabove, the gate electrode 30 is formed from a patterned n-type polycrystalline silicon film 29, but the lead-out portion (contact portion) 30a of the gate electrode 30 is also formed integrally with the gate electrode 30 from a conductor layer (that is, n-type polycrystalline silicon film 29), which is the layer identical to the gate electrode 30. The lead-out portion 30a of the gate electrode 30 is formed on the element separation region outside the active region of the epitaxial layer 22. Of the contact holes 72, the contact hole 72d is formed on the lead-out portion 30a of the gate electrode 30, and the plug (plug 73) filling up the contact hole 72d is electrically connected to the lead-out portion 30a of the gate electrode 30. A gate potential is applied to the gate electrode 30 via a gate wiring (not shown in the cross-sectional view in FIG. 19) comprising the wiring of the same layer as the wiring 74 and the plug 73 (not shown in the cross-sectional view in FIG. 19) filling up the contact hole 72d.

Further, as described hereinabove, the field plate electrode 44 is formed by anisotropically etching (etch back) the silicon film 42 and leaving the silicon film 42 (side wall spacer 43) with a side wall spacer shape on the side wall of the gate electrode 30, but the lead-out portion (contact portion) 44a of the field plate electrode 44 is also formed integrally with the field plate electrode 44 by the conductor layer (that is, the silicon film 42) of the same layer as the field plate electrode 44. In the process of forming the side wall spacer 43 by anisotropically etching the silicon film 42, no photoresist layer is formed on top of the side wall spacer 43, but the lead-out portion 44a of the field plate electrode 44 is formed integrally with the side wall spacer 43 together with the side wall spacer 43 by forming a photoresist layer and leaving the silicon film 42 in formation prediction region of the lead-out portion 44a. The lead-out portion 44a of the field plate electrode 44 is formed on the element separation region outside the active region of the epitaxial layer 22.

Of the contact holes 72, the contact hole 72e is formed above the lead-out portion 44a of the field plate electrode 44, and the plug (plug 73) filling up the contact hole 72e is electrically connected to the lead-out portion 44a of the field plate electrode 44. The plug (not shown in the cross-sectional view in FIG. 19) filling the contact hole 72e is electrically connected to the source electrode 74b. As a result, the field plate electrode 44 is connected to the source potential via the plug (not shown in the cross-sectional view in FIG. 19) filling the contact hole 72e and the source electrode 74b. In another mode, the plug (plug 73) filling up the contact hole 72e can be electrically connected to the wiring 74 other than the source electrode 74b, and a ground potential (or a fixed potential) can be supplied to the field plate electrode 44 via this wiring 74. Further, a potential (ground potential or fixed potential) other than the source potential and lower that the voltage applied to the gate electrode 30 or drain (n⁺-type train region 52) of the LDMOSFET can be also supplied to the field plate electrode 44.

As also shown in FIG. 19, in the semiconductor device of the present embodiment, as was described hereinabove, the epitaxial layer 22 is formed on the main surface of the substrate 21 and the LDMOSFET is formed on this epitaxial layer 22. The LDMOSFET has a configuration of an n-channel type and comprises the n⁻-type offset drain region 33, the n-type offset drain region 51, and the n⁺-type drain region 52 formed in the epitaxial layer 22, the n-type source region 34 and the n⁺-type source region 53 formed in the epitaxial layer 22, the gate insulating film 28 formed on the surface of the epitaxial layer 22, and the gate electrode 30 formed on top of the gate insulating film 28.

The n-type offset drain region 51 is formed in a position at a distance from the gate electrode 30, and the n⁺-type drain region 52 is formed in a position at a larger distance from the gate electrode 30. On the other hand, a punch-through stopper layer comprising a p-type well 26 having one end thereof extending below the gate electrode 30 is formed in the epitaxial layer 22 below the n⁺-type source region 53 and the n-type source region 34. Thus, the above-described LDMOSFET has an LD (Lateral Diffusion) structure comprising the punch through stopper layer and the drain offset with respect to the gate electrode 30.

Further, the p-type punching layer 24 comprising a p⁺-type semiconductor region with the bottom thereof reaching the substrate 21 is formed in the epitaxial layer 22 on the source side of the LDMOSFET, and the source (n⁺-type source region 53) of the LDMOSFET is electrically connected to the p-type punching layer 24 via the plug 73 (plugs 73a, 73b) and the source electrode 74b and further electrically connected to the substrate 21 and rear surface electrode 81. Therefore, the source (n⁺-type source region 53) of the LDMOSFET is electrically connected to the source potential (ground potential or fixed potential) supplied from the rear surface electrode 81.

The field plate electrode 44 with a side wall spacer shape is formed via an insulating film (side wall insulating film 31 and insulating film 41) on the side surface (side wall) of the gate electrode 30 on the drain side thereof. The field plate electrode 44 comprises, for example, a silicon film such as a p-type or n-type low-resistance polycrystalline silicon film.

A drain voltage of, for example, about 0-10 V is applied via the drain electrode 74a and the plug 73a to the n⁺-type drain region 52. A gate voltage of, for example, about 1.5-2 V is applied via the gate wiring (not shown in the cross-sectional view in FIG. 19) comprising a wiring of the same layer as the wiring 74 and the plug 73 (not shown in the cross-sectional view in FIG. 19) to the gate electrode 30. Further, the field plate electrode 44 is connected and fixed to a ground potential or fixed potential (fixed potential lower than the voltage applied to the drain). For example, the field plate electrode 44 is connected to the source potential.

Thus, in the present embodiment, the field plate electrode 44 electrically connected to the ground potential (or fixed potential) is formed on top of the n⁻-type offset drain region 33 where the electric field induced by the difference in potential between the n⁺-type drain region 52 and the gate electrode 30 is concentrated. As a result, the electric field of the n⁻-type offset drain region 33 is relaxed by the low-potential field plate electrode 44, thereby making it possible to inhibit the generation of hot carriers. Reliability of the semiconductor device can thus be increased.

Further, by forming the field plate electrode 44 on the side surface of the gate electrode 30 on the drain side thereof and electrically connecting and fixing the field plate electrode 44 to the ground potential (or fixed potential) makes it possible to reduce the capacitance (feedback capacitance) with the gate and drain because the field plate electrode 44 functions as a shield electrode located between the gate electrode 30 and the n$^+$-type drain region 52. Furthermore, depleting the zone below the field plate electrode 44 also serves to reduce the capacitance with the gate and drain. Therefore, the gain and efficiency of the LDMOSFET can be increased and high-frequency characteristic thereof can be improved.

Further, in the present embodiment, the metal silicide film 64 is formed by using a silicide process on the front surface (top portion) of the source (n$^+$-type source region 53) of the LDMOSFET, the front surface (top portion, upper surface) of the gate electrode 30, and the front surface (top portion) of part of the field plate electrode 44, and the metal silicide film 64 is not formed on the front surface (top portion) of the drain (n$^-$-type offset drain region 33, n-type offset drain region 51, and n$^+$-type drain region 52) of the LDMOSFET.

By contrast with the present embodiment, when the metal silicide film 64 is formed on the front surface (top portion) of the drain of the LDMOSFET, a comparatively high voltage is applied to the drain of the LDMOSFET. Therefore, a leak path is generated on the front surface (that is, between the gate electrode 30 and drain) of the epitaxial layer 22, and the leak current (leak current between the gate electrode 30 and drain) of the LDMOSFET element can increase. For example, if the metal silicide film 64 is formed on the drain of the LDMOSFET, then the electric field intensity in the drain/drain offset portion will increase, the drain offset portion will be depleted, and leak can be generated in the overlapping section of the gate electrode and offset drain portion. This can degrade the performance of the semiconductor device comprising the LDMOSFET element.

By contrast, in the present embodiment, because the metal silicide film 64 is not formed on the front surface (top portion) of the drain of the LDMOSFET, even if a comparatively high voltage is applied to the drain of the LDMOSFET, the formation of leak paths on the front surface (that is, between the gate electrode 30 and the drain) of the epitaxial layer 22 can be prevented and the leak current of the LDMOSFET element (leak current between the gate electrode 30 and the drain) can be reduced.

Furthermore, in the present embodiment, because the metal silicide film 64 is formed on the front surface of the source (n$^+$-type source region 53) of the LDMOSFET, the source resistance and ON resistance can be reduced and the performance of the semiconductor device having the LDMOSFET element can be increased. Furthermore, because a high voltage such as a drain is not applied to the source of the LDMOSFET, even if the metal silicide film 64 is formed on the front surface of the source (n$^+$-type source region 53) of the LDMOSFET, no leak path is formed on the front surface (that is, between the gate electrode 30 and the source) of the epitaxial layer 22 and the leak current between the gate electrode 30 and the source is not increased.

Further, in the present embodiment, the metal silicide film 64 is formed on the entire upper surface of the gate electrode 30. By forming the metal silicide film 64 on the entire upper surface of the gate electrode 30, it is possible to decrease the gate resistance and improve the performance of the semiconductor device having the LDMOSFET element.

Further, in the present embodiment, because the metal silicide film 64 is formed on the surface of part of the field plate electrode 44, the resistance of the field plate electrode 44 can be decreased and the effect of degreasing the capacitance between the gate and the drain (feedback capacitance) by the field plate electrode 44 can be further increased.

FIGS. 22 to 25 are cross-sectional views illustrating the main portions in the process for manufacturing the semiconductor device of the first comparative example studied by the inventors. In the process for manufacturing the semiconductor device of the first comparative example, the field plate electrode 44 comprising the side wall spacer 43, such as that of the present embodiment, is not formed.

Figure 22:
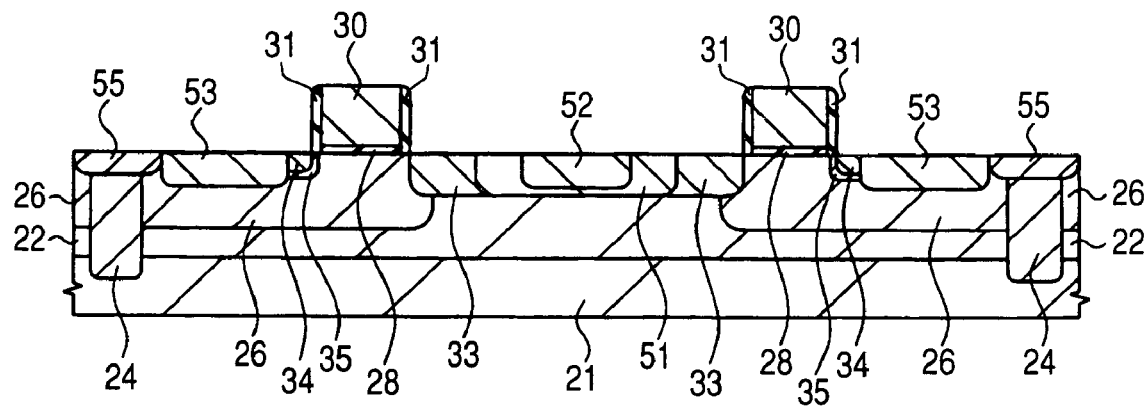
FIG. 22 is a cross-sectional view of the main portion in the process for the manufacture of a semiconductor device of the first comparative example.

In the process for manufacturing the semiconductor device of the first comparative example, the structure shown in FIG. 7 is obtained in the same manner as in the present embodiment, but then in contrast to the present embodiment, as shown in FIG. 22, the insulating film 41 and the side wall spacer 43 (silicon film 42) are not formed and the n$^+$-type drain region 52 and the n$^+$-type source region 53 are formed by ion implanting n-type dopants and using as a mask a photoresist pattern (not shown in the figure) having openings above part of the n$^-$-type offset drain region 33 and part of the source formation region. Then, a p$^+$-type semiconductor region 55 is formed in the top portion region of the p-type punching layer 24.

Figure 23:
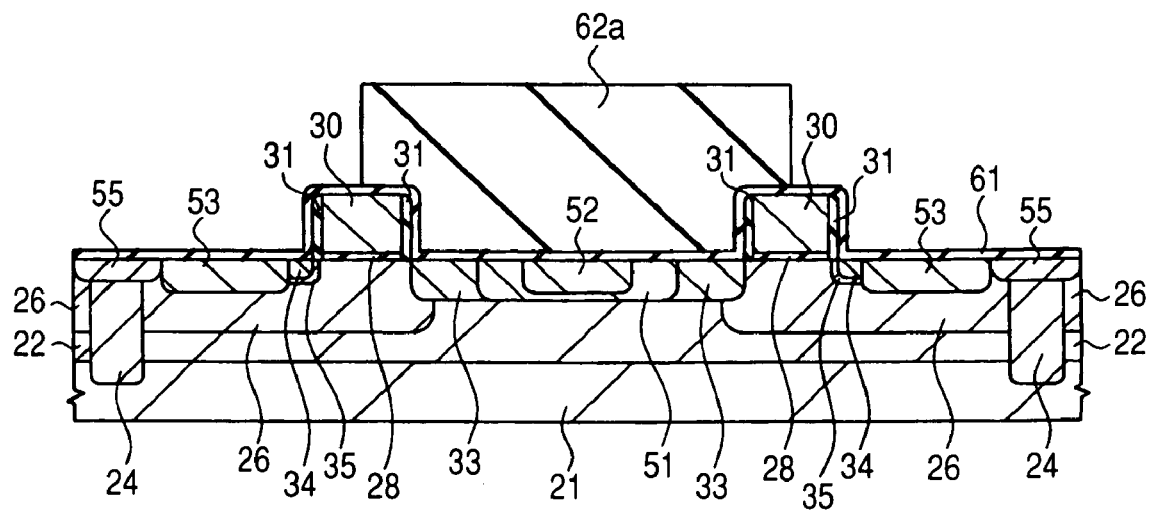
FIG. 23 is a cross-sectional view of the main portion in the process for the manufacture of a semiconductor device that follows the process shown in FIG. 22.

Then, as shown in FIG. 23, the insulating film 61 is formed on the substrate 21, followed by the formation of the photoresist pattern 62a on the insulating film 61. Because the photoresist pattern 62a has to be formed so as to cover the n$^-$-type offset drain region 33 and the n$^+$-type drain region 52, the end portion of the photoresist pattern 62a has to be positioned on the upper surface of the gate electrode 30, with consideration for the margin (for example, photomask misalignment and the like) during the formation of the photoresist pattern 62a.

Figure 24:
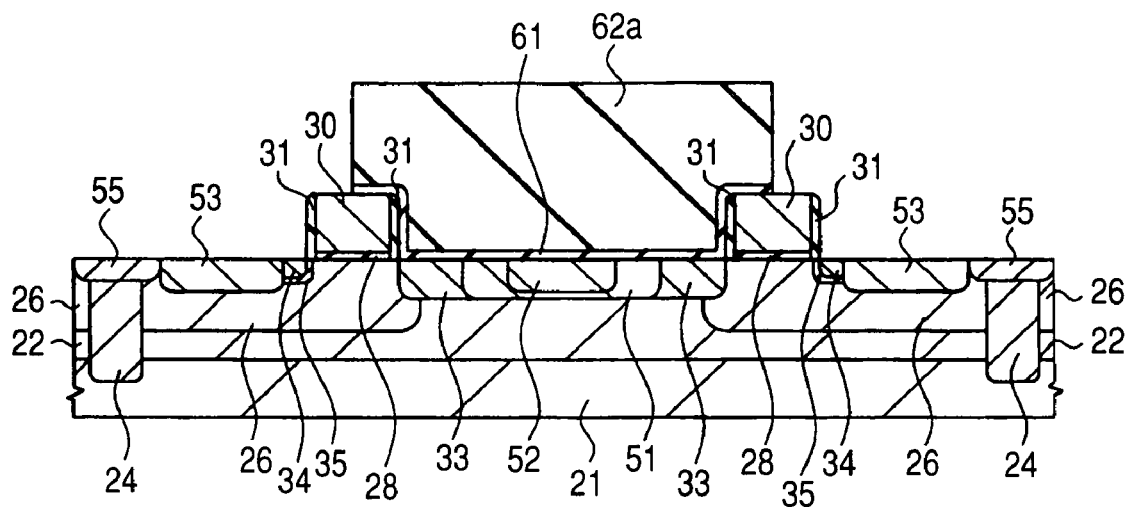
FIG. 24 is a cross-sectional view of the main portion in the process for the manufacture of a semiconductor device that follows the process shown in FIG. 23.

Then, as shown in FIG. 24, the photoresist pattern 62a is used as an etching mask and the exposed insulating film 61 is selectively removed by dry etching. As a result, the surface of the n-type source region 34 and the n$^+$-type source region 53 and part of the upper surface of the gate electrode 30 are exposed. The photoresist pattern 62a is then removed.

Figure 25:
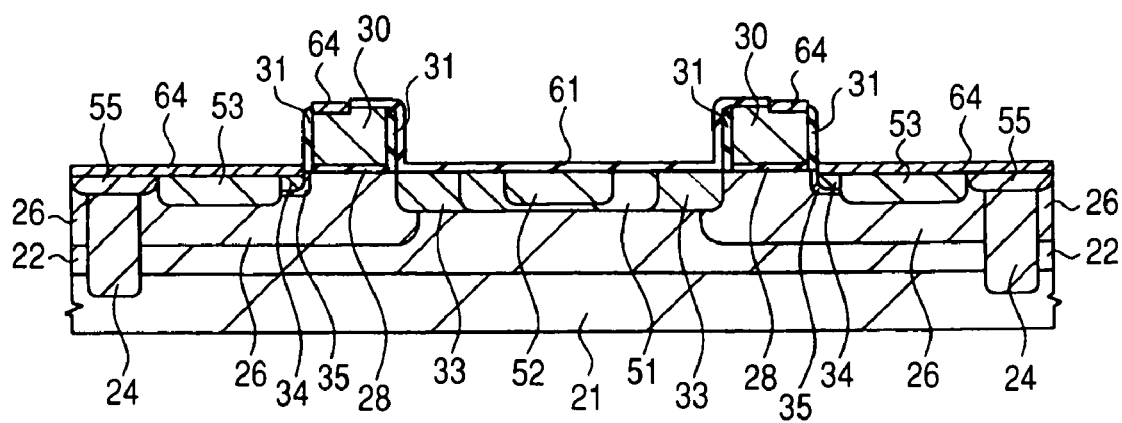
FIG. 25 is a cross-sectional view of the main portion in the process for the manufacture of a semiconductor device of the second comparative example.

Then, the metal silicide film 64 is selectively formed on the surface of the n-type source region 34 and the n$^+$-type source region 53 and part of the upper surface of the gate electrode 30 by depositing a metal film comprising, for example, a cobalt (Co) film and conducting a heat treatment. The unreacted metal film (for example, cobalt film) is thereafter removed. FIG. 25 shows a state after the formation of the metal silicide film 64 and removal of the unreacted metal film.

Because subsequent processing can be conducted in almost the same manner as in the present embodiment (process of FIG. 18 and FIG. 19), explanation thereof is herein omitted.

In the process for manufacturing the semiconductor device of the first comparative example, by patterning the insulating film 61 by using the photoresist pattern 62a, it is possible to cover the drain of the LDMOSFET with the insulating film 61, expose the source, and form the metal silicide film 64 on the source, without forming it on the drain. However, in the process for manufacturing the semiconductor device of the first comparative example, an alignment margin for a photomask during the formation of the photoresist pattern 62a is required with consideration for photomask misalignment associated with the accuracy of the exposure apparatus. Therefore, the end portion of the photoresist pattern 62a has to be positioned on the upper surface of the gate electrode 30. For this reason, the end portion of the patterned insulating film 61 is positioned on top of the gate electrode 30, and the upper surface of the gate electrode 30 is partially covered with the insulating film 61. For this reason, the metal silicide film 64 can be formed only locally on the upper surface of the gate electrode 30. For example, the formation surface area of the metal silicide film 64 on the upper surface of the gate electrode 30 is about half the surface area of the upper surface of the gate electrode 30. For this reason, the gate resistance increases and the performance of the semiconductor device having the LDMOSFET element degrades with respect to those of the present embodiment. Furthermore, in the process for manufacturing the semiconductor device of the first comparative example, if the metal silicide film 64 is attempted to be formed on the entire upper surface of the gate electrode 30, it becomes highly probable that the drain of the LDMOSFET will be exposed from the patterned insulating film 61 due to the relationship with the photomask alignment accuracy, and because the metal silicide film 64 is formed on the drain, the leak current between the gate electrode 30 and the drain increases.

By contrast, in the present embodiment, the photomask (during the formation of the photoresist pattern 62) can be aligned on the field plate electrode 44 comprising a comparatively thick side wall spacer 43 even with consideration for alignment margin. Therefore, the end portion of the photoresist pattern 62 is positioned above the field plate electrode 44, in the process of etching the insulating film 61, the insulating film 61 present on the gate electrode 30 can be removed and the entire upper surface of the gate electrode 30 can be exposed, and the metal silicide film 64 can be formed on the entire upper surface of the gate electrode 30. As a result, the gate resistance can be decreased. Furthermore, in the present embodiment, the capacitance between the gate and drain (feedback capacitance) can be decreased by forming the field plate electrode 44 on the side surface of the gate electrode 30 on the drain side thereof.

FIGS. 26 to 31 are cross-sectional views illustrating the main portions in the process for manufacturing the semiconductor device of the second comparative example studied by the inventors. In the present embodiment, a side wall spacer 43 comprising a comparatively thick silicon film 42 is formed, but in the process for manufacturing the semiconductor device of the second comparative example, a side wall spacer 143 is formed from a comparatively thick silicon oxide film 142.

Figure 26:
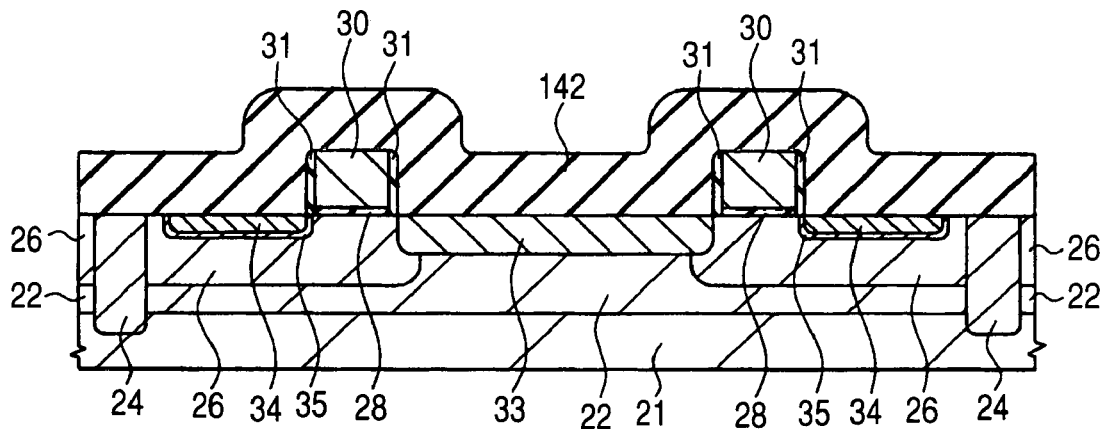
FIG. 26 is a cross-sectional view of the main portion in the process for the manufacture of a semiconductor device that follows the process shown in FIG. 25.

In the process for manufacturing the semiconductor device of the second comparative example, the structure shown in FIG. 7 is obtained in the same manner as in the present embodiment, but then in contrast to the present embodiment, as shown in FIG. 26, the formation of the insulating film 41 is omitted and the silicon oxide film 142 is formed instead of the silicon film 42 of the present embodiment. The film thickness of the silicon oxide film 142 is equivalent to a sum of the film thickness of the insulating film 41 and the silicon film 42 of the present embodiment.

Figure 27:
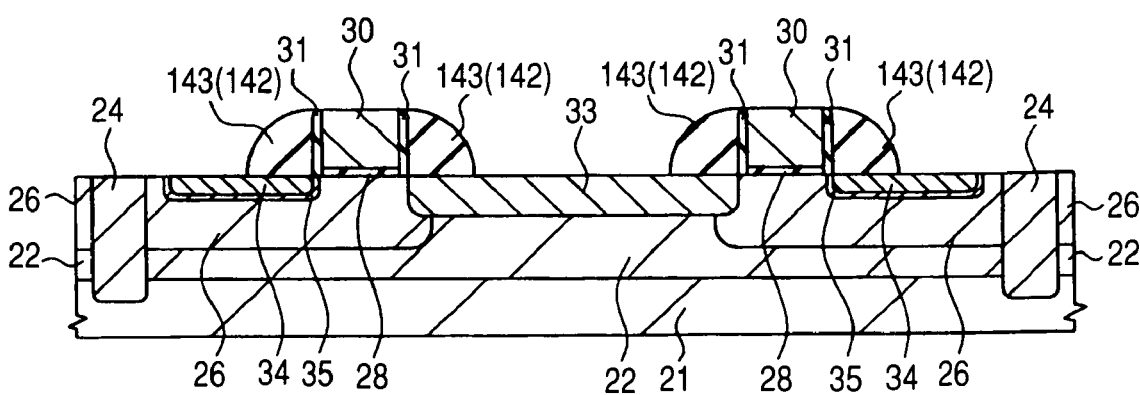
FIG. 27 is a cross-sectional view of the main portion in the process for the manufacture of a semiconductor device that follows the process shown in FIG. 26.

Then, as shown in FIG. 27, the silicon oxide film 142 is subjected to etch back by anisotropic etching and a side wall spacer 143 is formed that is composed of a silicon oxide film 142 remaining on the side wall of the gate electrode 30.

After the etch back of the silicon oxide film 142, the side wall spacer 143 comprising the silicon oxide film 142 is formed on both side surfaces (side walls) of the gate electrode 30, that is, on the source side and drain side thereof, but the side wall spacer 143 located on the side surface of the gate electrode 30 on the source side thereof is difficult to remove. When dry etching is conducted after forming the photoresist pattern 45, such as in the present embodiment, covering the side wall spacer 143 located on the side surface (side wall) of the gate electrode 30 on the drain side thereof with the photoresist pattern 45, and exposing the side wall spacer 143 located on the side surface (side wall) of the gate electrode 30 on the source side thereof, the side wall spacer 143 located on the side surface of the gate electrode 30 on the source side thereof can be removed, but large damage caused by dry etching is provided to the region that becomes the source of the LDMOSFET.

Figure 28:
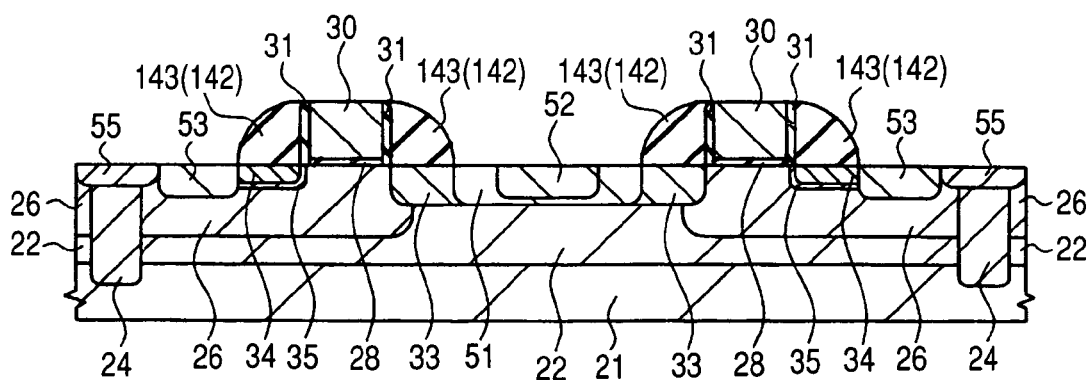
FIG. 28 is a cross-sectional view of the main portion in the process for the manufacture of a semiconductor device that follows the process shown in FIG. 27.

For this reason, after the silicon oxide film 142 has been subjected to etch back, as shown in FIG. 28, ion implantation is conducted in a state in which the side wall spacer 143 comprising the silicon oxide film 142 remains on both side surfaces of the gate electrode 30, that is, on the source and drain sides thereof, and the n-type offset drain region 51, the $n^+$-type drain region 52, the $n^+$-type source region 53, and the $p^+$-type semiconductor region 55 are formed. The n-type offset drain region 51 is formed with self alignment with respect to the side wall spacer 143 on the side surface of the gate electrode 30 on the drain side thereof, and the $n^+$-type source region 53 is formed with self alignment with respect to the side wall spacer 143 on the side surface of the gate electrode 30 on the source side thereof.

Figure 29:
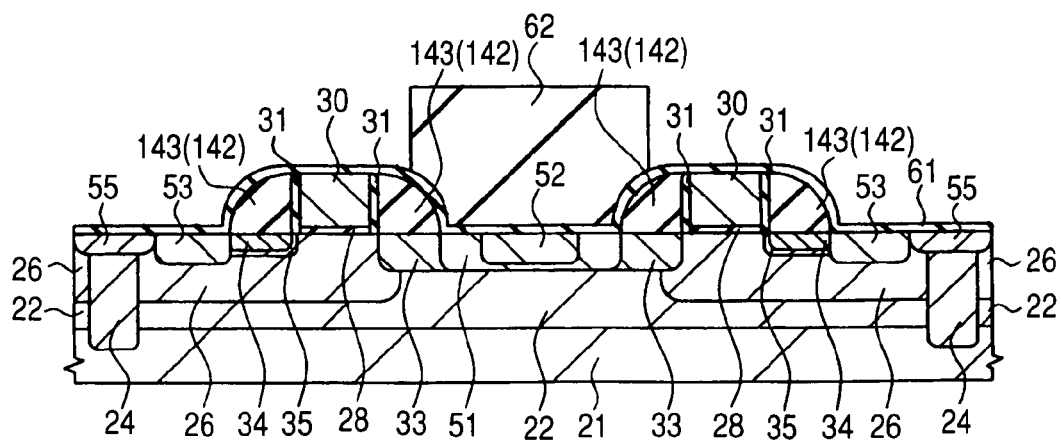
FIG. 29 is a cross-sectional view of the main portion in the process for the manufacture of a semiconductor device that follows the process shown in FIG. 28.

Then, similarly to the present embodiment, the insulating film 61 is formed on the substrate 21, as shown in FIG. 29. The photoresist pattern 62 is then formed on the insulating film 61. The photoresist pattern 62 is formed so as to cover the n-type offset drain region 51 and the $n^+$-type drain region 52, but not to cover the $n^+$-type source region 53 and the gate electrode 30. As a result, the end portion of the photoresist pattern 62 is positioned on the side wall spacer 143 on the side surface of the gate electrode 30 on the drain side thereof.

Figure 30:
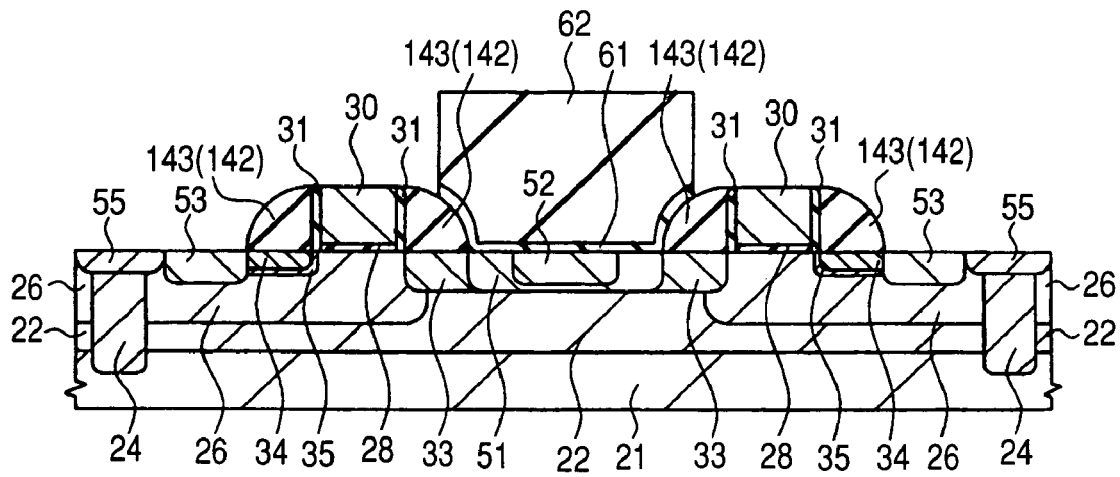
FIG. 30 is a cross-sectional view of the main portion in the process for the manufacture of a semiconductor device that follows the process shown in FIG. 29.

Then, as shown in FIG. 30, the exposed insulating film 61 is selectively removed by dry etching by using the photoresist pattern 62 as an etching mask. As a result, the insulating film 61 located on the n-type offset drain region 51 and the $n^+$-type drain region 52 remains, the insulating film 61 located on the $n^+$-type source region 53 and the gate electrode 30 is removed, and the upper surfaces of the $n^+$-type source region 53 and the gate electrode 30 are exposed. The photoresist pattern 62 is thereafter removed.

Figure 31:
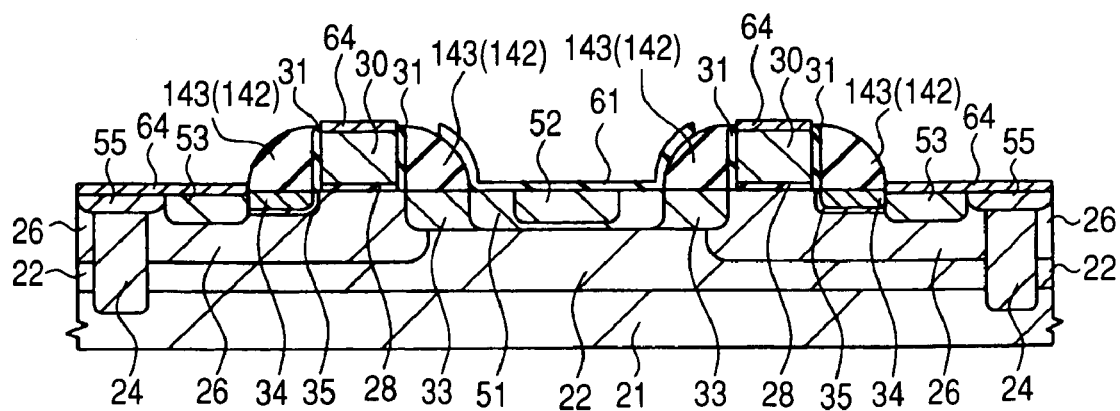
FIG. 31 is a cross-sectional view of the main portion in the process for the manufacture of a semiconductor device that follows the process shown in FIG. 30.

Then, the metal silicide film 64 is selectively formed on the surface (top portion) of the $n^+$-type source region 53 and the gate electrode 30 by depositing a metal film (metal film 61) comprising, for example, a cobalt (Co) film and then conducting a heat treatment. Then, the unreacted metal film (for example, cobalt film) is removed. FIG. 31 shows a state after the metal silicide film 64 has been formed and the unreacted metal film has been removed.

Because subsequent processing can be conducted in almost the same manner as in the present embodiment (process of FIG. 18 and FIG. 19), explanation thereof is herein omitted.

In the process for manufacturing the semiconductor device of the second comparative example, the comparatively thick side wall spacer 143 comprising a silicon oxide film 142 is formed on both side surfaces of the gate electrode 30, that is, on the source and drain sides thereof, by conducting etch back of a comparatively thick silicon oxide film 142 by anisotropic etching. For this reason, the photomask alignment (during the formation of the photoresist pattern 62) can be performed on the side wall spacer 143 even with the alignment margin taken into account. Therefore, the end portion of the photoresist pattern 62 is positioned on the side wall spacer 143, in the process of etching the insulating film 61, the insulating film 61 present on the gate electrode 30 can be removed and the entire upper surface of the gate electrode 30 can be exposed, and the metal silicide film 64 can be formed on the entire upper surface of the gate electrode 30. As a result, the gate resistance can be decreased.

However, in the process for manufacturing the semiconductor device of the second comparative example, of the side wall spacers 143 formed on both side surfaces of the gate electrode 30, that is, on the source side and drain side thereof, the side wall spacer 143 located on the side surface of the gate electrode 30 on the source side thereof is difficult to remove. When dry etching is conducted after forming the photoresist pattern 45, such as in the present embodiment, covering the side wall spacer 143 located on the side surface of the gate electrode 30 on the drain side thereof with the photoresist pattern 45, and exposing the side wall spacer 143 located on the side surface of the gate electrode 30 on the source side thereof, the side wall spacer 143 located on the side surface of the gate electrode 30 on the source side thereof can be removed, but a large damage is provided to the region that becomes the source of the LDMOSFET.

For this reason, in the process for manufacturing the semiconductor device of the second comparative example, the n$^+$-type source region 53 is formed by conducting ion implantation after leaving a thick side wall spacer 143 on the side surface of the gate electrode 30 on the source side thereof, but the n$^+$-type source region 53 that was formed and the gate electrode 30 are at a rather large distance from each other (that is, the n$^+$-type source region 53 is at a rather large distance from the channel region). As a result, in addition to the increased source resistance, the performance of the semiconductor device having the LDMOSFET element is degraded by comparison with that of the device of the present embodiment.

By contrast, in the present embodiment, the comparatively thick silicon film 42 is subjected to etch back by anisotropic etching and a comparatively thick side wall spacer 43 comprising the silicon film 42 is formed on the side surface (side wall) of the gate electrode 30. Because the side wall spacer 43 is formed from a silicon film capable of ensuring a high etching selection ratio with respect to insulating films such as silicon oxide film, of the side wall spacers 43 formed on both side surfaces (side walls) of the gate electrode 30, that is, on the source side and drain side thereof, only the side wall spacer 43 located on the side surface (side wall) of the gate electrode on the source side thereof can be easily removed. When dry etching is conducted after covering the side wall spacer 43 located on the side surface of the gate electrode 30 on the drain side thereof with the photoresist pattern 45, as in the present embodiment, and exposing the side wall spacer 43 located on the side surface (side wall) of the gate electrode 30 on the source side thereof, the dry etching can be conducted under conditions such that the etching rate of the silicon film 42 (side wall spacer 43) is higher than the etching rate of the insulating film 41 comprising a silicon oxide film. As a result, the side wall spacer 43 located on the side surface (side wall) of the gate electrode 30 on the source side thereof can be removed, while protecting the region that will become a source with the insulating film 61 and preventing it from being damaged by the dry etching.

Therefore, in the present embodiment, the n$^+$-type source region 53 can be formed by ion implantation after the thick side wall spacer 43 has been removed from the side surface of the gate electrode 30 on the source side thereof. For this reason, the n$^+$-type source region 53 that was formed and the gate electrode 30 can be prevented from being at a rather large distance from each other (that is, to prevent the n$^+$-type source region 53 from being at a rather large distance from the channel region) and the source resistance can be decreased. Furthermore, the ON resistance of the LDMOSFET can be also decreased. Further, in the present embodiment, the capacitance between the gate and the drain (feedback capacitance) can be decreased by forming the field plate electrode 44 on the side surface (side wall) of the gate electrode 30 on the drain side thereof.

FIGS. 32 to 35 are cross-sectional views illustrating the main portions in the process for manufacturing the semiconductor device of the third comparative example studied by the inventors. In the present embodiment, the field plate electrode 44 with a side wall spacer shape is formed by etch back processing the silicon film 42, but in the process for manufacturing the semiconductor device of the third comparative example, the feed plate electrode is formed by patterning the silicon film by using a photoresist pattern as an etching mask.

Figure 32:
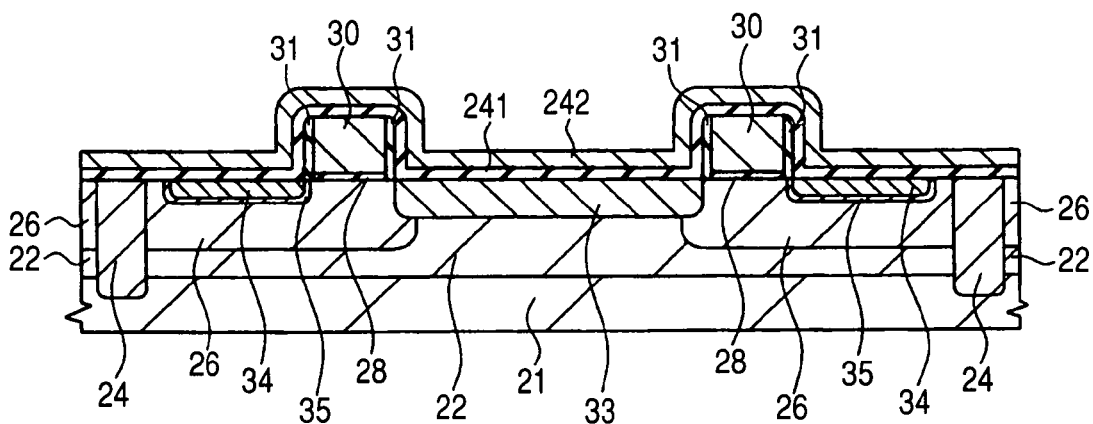
FIG. 32 is a cross-sectional view of the main portion in the process for the manufacture of a semiconductor device of the third comparative example.

In the process for manufacturing the semiconductor device of the third comparative example, after the structure shown in FIG. 7 is obtained in the same manner as in the present embodiment, an insulating film 241 comprising a silicon oxide film is formed and then a silicon film 242 is formed on the insulating film 241, as shown in FIG. 32. The silicon film 242 comprises a polycrystalline silicon film and the thickness of the silicon film 242 is larger than that of the silicon film 42.

Figure 33:
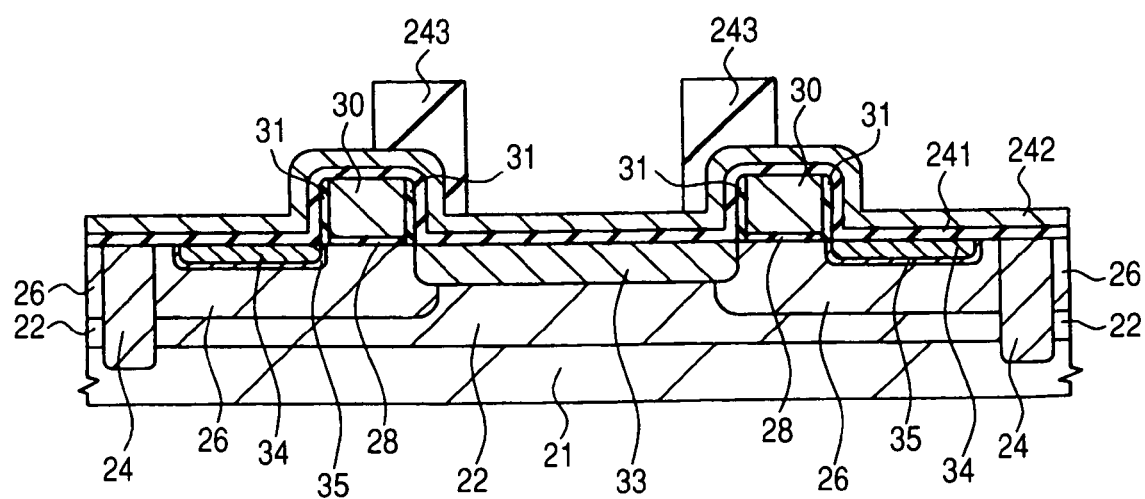
FIG. 33 is a cross-sectional view of the main portion in the process for the manufacture of a semiconductor device that follows the process shown in FIG. 32.
Figure 34:
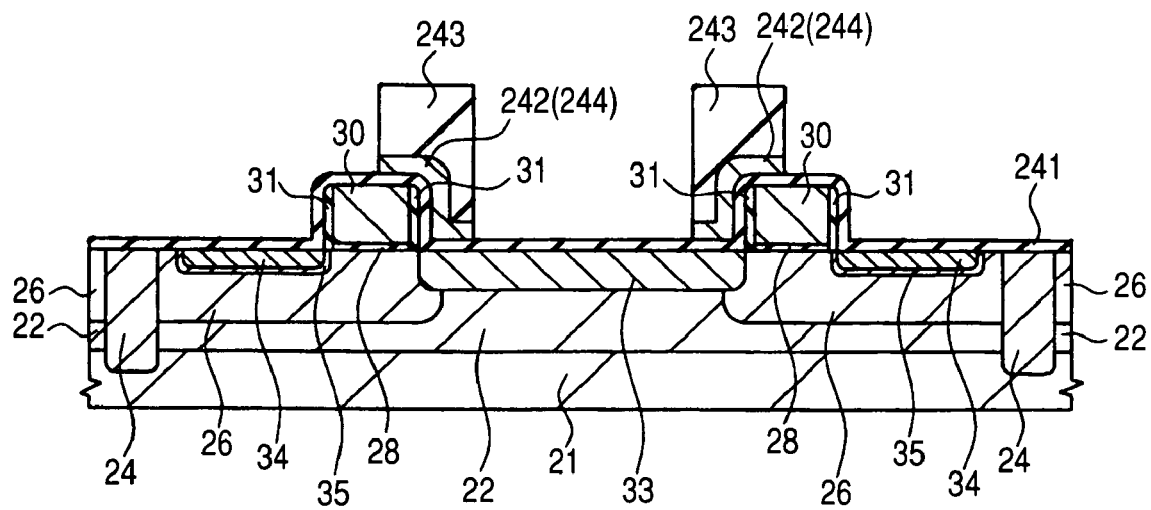
FIG. 34 is a cross-sectional view of the main portion in the process for the manufacture of a semiconductor device that follows the process shown in FIG. 33.
Figure 35:
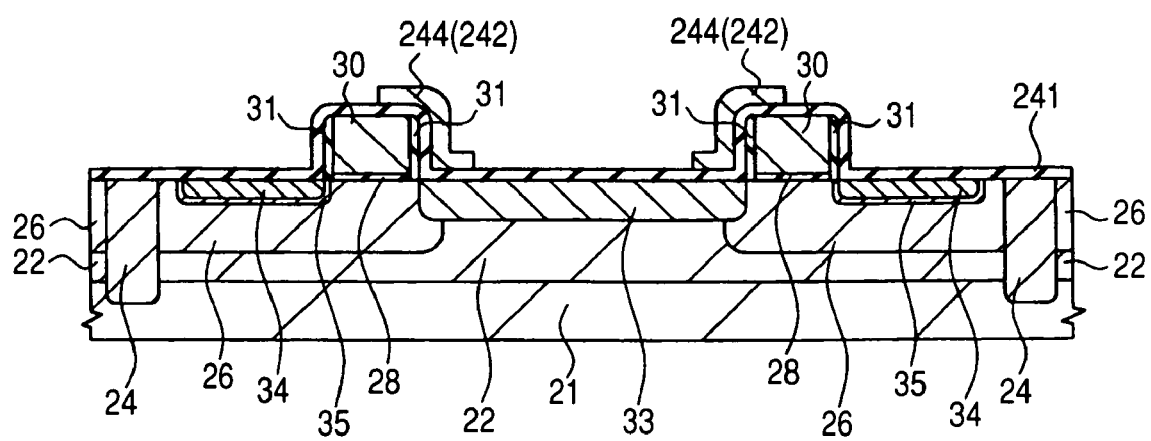
FIG. 35 is a cross-sectional view of the main portion in the process for the manufacture of a semiconductor device that follows the process shown in FIG. 34.

Then, as shown in FIG. 33, a photoresist pattern (photoresist layer) 243 is formed on the silicon film 242 by using a photolithography method. Then, the silicon film 242 is patterned by dry etching the silicon film 242 by using the photoresist pattern 243 as an etching mask, as shown in FIG. 34. As a result, a field plate electrode 244 comprising a patterned silicon film 242 is formed on the side surface of the gate electrode 30 on the drain side thereof. In the third comparative example, because the field plate electrode 244 is formed by pattering the silicon film 242 by dry etching using the photoresist pattern 243 as an etching mask, an alignment margin of the photomask and the gate electrode 30 is required and the upper end portion of the field plate electrode 244 is formed so as to cover part of the upper portion of the gate electrode 30. Then, as shown in FIG. 35, the photoresist pattern 243 is removed. The explanation of subsequent operations is herein omitted.

In the process for manufacturing the semiconductor device of the third comparative example, because the field plate electrode 244 is formed by pattering the silicon film 242 by dry etching using the photoresist pattern 243 as an etching mask, with consideration for the misalignment of the photomask associated with the accuracy of the exposure apparatus or the like, an alignment margin of the photomask (during formation of the photoresist pattern 243) and the gate electrode 30 is required and the upper end portion of the field plate electrode 244 is formed so as to cover part of the upper portion of the gate electrode 30. Thus, the upper surface of the gate electrode 30 is partially covered by the field plate electrode 244 and the insulating film 241 located therebelow. As a result, even though the metal silicide film 64 is formed by conducting a silicide process, because the upper surface of the gate electrode 30 is partially covered by the field plate electrode 244 and the insulating film 241 located therebelow, the metal silicide film 64 can be formed only locally on the upper surface of the gate electrode 30. For example, the formation surface area of the metal silicide film 64 on the upper surface of the gate electrode 30 is about half the surface area of the upper surface of the gate electrode 30. For this reason, the gate resistance increases and the performance of the semiconductor device having the LDMOSFET element degrades with respect to those of the present embodiment. Furthermore, in the process for manufacturing the semiconductor device of the third comparative example, if the entire upper surface of the gate electrode 30 is planned not to be covered with the field plate electrode 244, then the field plate electrode 244 cannot be formed accurately on the side surface of the gate electrode 30 on the drain side thereof due to the relationship with the alignment accuracy.

By contrast, in the present embodiment, the silicon film 42 is subjected to etch back by anisotropic etching, a comparatively thick side wall spacer 43 comprising the silicon film 42 is formed on the side surface (side wall) of the gate electrode 30, and the field plate electrode 44 is formed by this sidewall spacer 43. Therefore, the field plate electrode 44 with a side wall spacer shape is formed and the field plate electrode 44 can be prevented from overlapping the upper surface of the gate electrode 30. Thus, the field plate electrode 44 does not extend on the upper surface of the gate electrode 30. Because the field plate electrode 44 does not overlap the upper surface of the gate electrode 30 and a photomask (during the formation of the photoresist pattern 62) can be aligned on the field plate electrode 44 of the side wall spacer shape, the end portion of the photoresist pattern 62 is positioned on the field plate electrode 44, the entire upper surface of the gate electrode 30 can be exposed prior to the silicide process, and the metal silicide film 64 can be formed over the entire upper surface of the gate electrode 30 in the silicide process. As a result, the gate resistance can be decreased.

Thus, in the present embodiment, because the metal silicide film 64 is not formed on the drain of the LDMOSFET, the leak current of the LDMOSFET element can be reduced, because the metal silicide film 64 is formed on the source ($n^+$-type source region 53) of the LDMOSFET, the source resistance or ON resistance can be decreased, and because the metal silicide film 64 can be formed on the entire upper surface of the gate electrode 30 of the LDMOSFET, the gate resistance can be decreased. By forming the field plate electrode 44, it is possible to decrease the capacitance between the gate and drain (feedback capacitance).

Forming the amplification circuit formed from such an LDMOSFET in a semiconductor chip 2 makes it possible to increase the addition efficiency (efficiency, power efficiency) $\eta_{add}$ Of the semiconductor chip 2 and increase the addition efficiency (efficiency, power efficiency) $\eta_{add}$ of the RF power module 1 using the semiconductor chip 2. Thus, both the reduction of the leak current and the increase in the addition efficiency (efficiency, power efficiency) can be attained and the performance of the semiconductor device (semiconductor chip 2 and the RF power module 1 using the semiconductor chip 2) can be improved.

Here, the addition efficiency $\eta_{add}$ is represented by the first formula:

$$\eta_{add} = \eta_d(1-1/G_P)$$

In this formula, $\eta_d$ is represented by the second formula:

$$\eta_d = k\gamma(1-R_{on}/(V_{dd} \times 1_d)$$

The power gain $G_P$ is represented by the third formula:

$$G_P = (f_T/f)^2 \times ((4g_d(R_i+R_s+R_g+\pi f_T L_s)+4\pi f_T C_{gd}(R_i+R_s+2R_g+2\pi f_T L_s)))^{-1}$$

In the second and third formulas, $V_{dd}$ corresponds to a drain voltage, $I_d$—a drain current, $R_{on}$—an ON resistance, $\gamma$—a transfer efficiency, $f_T$—a cutoff frequency, $R_s$—a source resistance, $R_g$—a gate resistance, and $C_{gd}$—a feedback capacitance.

In the present embodiment, as described hereinabove, the ON resistance $R_{on}$, source resistance $R_s$, gate resistance $R_g$, and feedback capacitance $C_{gd}$ can be decreased. As also follows from the first to third formulas, the decrease in the source resistance $R_s$, the decrease in the gate resistance $R_g$, and the decrease in the feedback capacitance $C_{gd}$ act to increase the addition efficiency $\eta_{add}$. Therefore, in the present embodiment, the addition efficiency of the semiconductor device (semiconductor chip 2) having the LDMOSFET and the RF power module 1 using the semiconductor device can be increased and the addition efficiency can be increased, for example, by about 5%.

The invention created by the inventors was specifically explained hereinabove based on the embodiment thereof, but the present invention is not limited to the above-described embodiment and it goes without saying that various modifications may be made in the invention without departing from the essence thereof.

The present invention can be advantageously employed in semiconductor devices used in high-frequency power amplifiers for cellular phones.

What is claimed is:

1. The manufacturing method of a semiconductor device comprising an LDMOSFET having a source region, a drain region, and a gate electrode formed on a main surface of a semiconductor substrate, comprising the steps of:

(a) preparing said semiconductor substrate of a first conductivity type;

(b) forming said gate electrode via a gate insulating film over the main surface of said semiconductor substrate;

(c) forming a first insulating film so as to cover said gate electrode over the main surface of said semiconductor substrate;

(d) forming a first conductor film on said first insulating film; and (e) forming a field plate electrode with a side wall spacer shape comprising said first conductor film over a side surface of said gate electrode over a side of said drain region by anisotropically etching said first conductor film, wherein in said step (e), a conductor portion with a side wall spacer shape comprising said first conductor film is formed over the side surface of said gate electrode over the side of said source region, and said manufacturing method further comprising:

(f) after said step (e), removing said conductor portion present over the side surface of said gate electrode over the side of said source region and leaving said field plate electrode on the side surface of said gate electrode on the said of said drain region, wherein in said step (a), said semiconductor substrate comprising silicon is prepared, in said step (b), said gate electrode comprising silicon is formed, said manufacturing method further comprising, after said step (f), the steps of:

(g) forming a second insulating film so as to cover said gate electrode and said field plate electrode over the main surface of said semiconductor substrate;

(h) forming an etching mask layer on said drain region located over said second insulating film;

(i) removing said second insulating film located over said gate electrode and over said source region and leaving said second insulating film over said drain region by etching using said etching mask layer as an etching mask; and (j) forming a metal silicide film on said gate electrode and on said source region.

2. The manufacturing method of a semiconductor device according to claim 1, wherein said etching mask layer comprises a photoresist layer.

3. The manufacturing method of a semiconductor device according to claim 1, wherein in said step (h), said etching mask layer is formed so that the end portion of said etching mask layer is positioned over said field plate electrode.

4. The manufacturing method of a semiconductor device according to claim 1, wherein said step (j) comprises the steps of:

(j1) forming a metal film on said semiconductor substrate above said gate electrode and above said source region;

(j2) forming said metal silicide film by conducting a heat treatment and inducing the reaction of said metal film with the top portion of said gate electrode and top portion of said source region; and (j3) removing unreacted metal film.

5. The manufacturing method of a semiconductor device according to claim 1, wherein said first conductor film comprises a silicon film.

* * * * *